US010840297B2

(12) United States Patent
Tahmasebi et al.

(10) Patent No.: US 10,840,297 B2
(45) Date of Patent: Nov. 17, 2020

(54) STORAGE LAYER FOR MAGNETIC MEMORY WITH HIGH THERMAL STABILITY

(71) Applicant: GLOBALFOUNDRIES Singapore Pte. Ltd., Singapore (SG)

(72) Inventors: Taiebeh Tahmasebi, Singapore (SG); Chim Seng Seet, Singapore (SG); Vinayak Bharat Naik, Singapore (SG); Chenchen Jacob Wang, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 11 days.

(21) Appl. No.: 16/168,811

(22) Filed: Oct. 23, 2018

(65) Prior Publication Data

US 2019/0067368 A1 Feb. 28, 2019

Related U.S. Application Data

(62) Division of application No. 15/081,971, filed on Mar. 28, 2016, now Pat. No. 10,128,309.

(Continued)

(51) Int. Cl.
*H01L 43/02* (2006.01)
*H01L 27/22* (2006.01)
(Continued)

(52) U.S. Cl.
CPC ........ *H01L 27/228* (2013.01); *G11C 11/161* (2013.01); *G11C 11/1659* (2013.01); *H01L 43/08* (2013.01); *H01L 43/12* (2013.01)

(58) Field of Classification Search
CPC ........ H01L 43/12; H01L 43/08; H01L 43/10; H01L 27/228; H01L 29/66984
See application file for complete search history.

(56) References Cited

U.S. PATENT DOCUMENTS 6,518,588 B1 2/2003 Parkin et al.
6,960,480 B1 11/2005 Horng et al.
(Continued)

FOREIGN PATENT DOCUMENTS

WO 2012154411 A1 11/2012
WO 2014063939 A1 5/2014

OTHER PUBLICATIONS

Long You et. al., Co/Ni multilayers with perpendicular anisotropy for spintronic device applications, Applied Physics Letters 100, Apr. 26, 2012, pp. 172411-1-172411-4, 100-172411, AIP Publishing, Melville, NY.

(Continued)

*Primary Examiner* — Jaehwan Oh
(74) *Attorney, Agent, or Firm* — Thompson Hine LLP

(57) ABSTRACT

Memory cells and method of forming thereof are presented. The method includes forming a magnetic tunnel junction (MTJ) element which includes a fixed magnetic layer, a tunneling barrier layer and a composite free magnetic layer. The composite free magnetic layer includes an insertion layer between first and second free magnetic layers. The insertion layer includes an oxide or oxidized layer. The insertion layer increases the overall thickness of the free layer, decreasing switching current as well as thermal stability. The oxidized layer may be MgO or $HfO_x$. A surface layer may be provided over the oxide or oxidized layer to further enhance magnetic anisotropy to further decrease switching current. The surface layer is Ta, Ti or Hf.

10 Claims, 23 Drawing Sheets

Related U.S. Application Data

(60) Provisional application No. 62/138,984, filed on Mar. 27, 2015.

(51) Int. Cl.
  H01L 43/12 (2006.01)
  H01L 43/08 (2006.01)
  G11C 11/16 (2006.01)

(56) References Cited

U.S. PATENT DOCUMENTS

| | | | |
|---|---|---|---|
| 7,453,671 B1* | 11/2008 | Nibarger | G11B 5/397 360/316 |
| 9,437,811 B2 | 9/2016 | Xiao | |
| 9,754,653 B2 | 9/2017 | Prejbeanu | |
| 2004/0174740 A1 | 9/2004 | Lee et al. | |
| 2005/0219769 A1* | 10/2005 | Shimura | B82Y 25/00 360/324.2 |
| 2006/0262594 A1 | 11/2006 | Fukumoto | |
| 2009/0027810 A1 | 1/2009 | Horng et al. | |
| 2009/0046397 A1 | 2/2009 | Sun et al. | |
| 2009/0147392 A1 | 6/2009 | Prejbeanu et al. | |
| 2009/0256220 A1* | 10/2009 | Horng | H01L 43/12 257/421 |
| 2009/0261434 A1 | 10/2009 | Kang et al. | |
| 2010/0072524 A1* | 3/2010 | Huai | B82Y 25/00 257/295 |
| 2010/0072566 A1 | 3/2010 | Kang et al. | |
| 2010/0080049 A1 | 4/2010 | Zheng et al. | |
| 2010/0096716 A1* | 4/2010 | Ranjan | B82Y 10/00 257/421 |
| 2011/0014500 A1 | 1/2011 | Horng et al. | |
| 2011/0293967 A1 | 12/2011 | Zhang et al. | |
| 2011/0298456 A1 | 12/2011 | Lu et al. | |
| 2012/0135273 A1* | 5/2012 | Horng | H01F 41/307 428/828.1 |
| 2012/0205759 A1 | 8/2012 | Hu | |
| 2012/0267733 A1 | 10/2012 | Hu et al. | |
| 2012/0292724 A1 | 11/2012 | Lim et al. | |
| 2012/0313191 A1* | 12/2012 | Whig | H01L 43/02 257/421 |
| 2013/0075837 A1 | 3/2013 | Chen et al. | |
| 2013/0075839 A1 | 3/2013 | Chen et al. | |
| 2013/0187248 A1 | 7/2013 | Kariyada et al. | |
| 2014/0027869 A1 | 1/2014 | Lee et al. | |
| 2014/0070341 A1 | 3/2014 | Beach et al. | |
| 2014/0103469 A1 | 4/2014 | Jan et al. | |
| 2014/0117476 A1 | 5/2014 | Kuo et al. | |
| 2014/0145792 A1 | 5/2014 | Wang et al. | |
| 2014/0175583 A1 | 6/2014 | Doyle et al. | |
| 2014/0197504 A1 | 7/2014 | Moriyama et al. | |
| 2014/0273284 A1 | 9/2014 | Annunziala | |
| 2014/0306302 A1 | 10/2014 | Jan et al. | |
| 2015/0008547 A1 | 1/2015 | Pi et al. | |
| 2015/0008550 A1 | 1/2015 | Min et al. | |
| 2015/0061058 A1 | 3/2015 | Jan et al. | |
| 2015/0171316 A1 | 6/2015 | Park et al. | |
| 2016/0043309 A1 | 2/2016 | Annunziata et al. | |
| 2016/0111632 A1* | 4/2016 | Sandhu | H01L 43/08 257/421 |
| 2016/0163970 A1 | 6/2016 | Xiao | |
| 2016/0211445 A1 | 7/2016 | Xiao | |
| 2016/0254445 A1 | 9/2016 | Tahmasebi et al. | |
| 2016/0276580 A1 | 9/2016 | Tahmasebi et al. | |
| 2016/0284763 A1 | 9/2016 | Tahmasebi et al. | |
| 2017/0025602 A1* | 1/2017 | Liu | G11C 11/161 |

OTHER PUBLICATIONS

H. Kurt et al., Enhanced perpendicular magnetic anisotropy in Co/Ni multilayers with a thin seed layer, Journal of Applied Physics 108, Oct. 7, 2010, pp. 073916-1-073916-4, 108-073916, AIP Publishing, Melville, NY.

Adrien Le Goff et al., Effect of Ta Insertion in Reference Layers of MTJs With Perpendicular Anisotropy, IEEE Transactions on Magnetics, Nov. 2014, vol. 50, No. 11.

Maria Patricia Rouelli Sabino et al., Influence of Ta insertions on the magnetic properties of MgO/CoFeB/MgO films probed by ferromagnetic resonance, Japan Society of Applied Physics, 2014.

D. C. Worledge et al., Spin torque switching of perpendicular Ta CoFeB MgO-based magnetic tunnel junctions, 2011, Applied Physics Letter 98, 022501, USA.

Matthias Gottwald et al., ParamagneticFexTa1-x alloys for engineering of perpendicularly magnetized tunnel junctions, APL Materials, 2013, vol. 1, Issue 2, USA.

Lea Cuchet et al., Influence of a Ta spacer on the magnetic and transport properties of perpendicular magnetic tunnel junctions, 2013, Applied Physics Letters 103, 052402, AIP Publishing.

T. Liu et al., "Thermally robust Mo/CoFeB/MgO trilayers with strong perpendicular magnetic anisotropy", Scientific Reports, 2014.

Di Wu et al., "Enhancement of perpendicular magnetic anisotropy in Co/Ni multilayers by in situ annealing the Ta/Cu under-layers", Applied Physics Letters, 2013, vol. 103, No. 24, AIP Publishing.

G. S. Kar et al., Co/Ni Based p-MTJ Stack for Sub-20nm High Density Stand Alone and High Performance Embedded Memory Application, IEEE International Electron Devices Meeting (IEDM), 2014, pp. 1-4, IMEC Leuven, Belgium.

Chaelyoung Kim et al., Bottom Electrode Surface Treatment Effect on MTJ in MRAM Device, Honolulu PRiME, 2012, Abstract #2502, The Electrochemical Society, Honolulu, Hawaii.

* cited by examiner

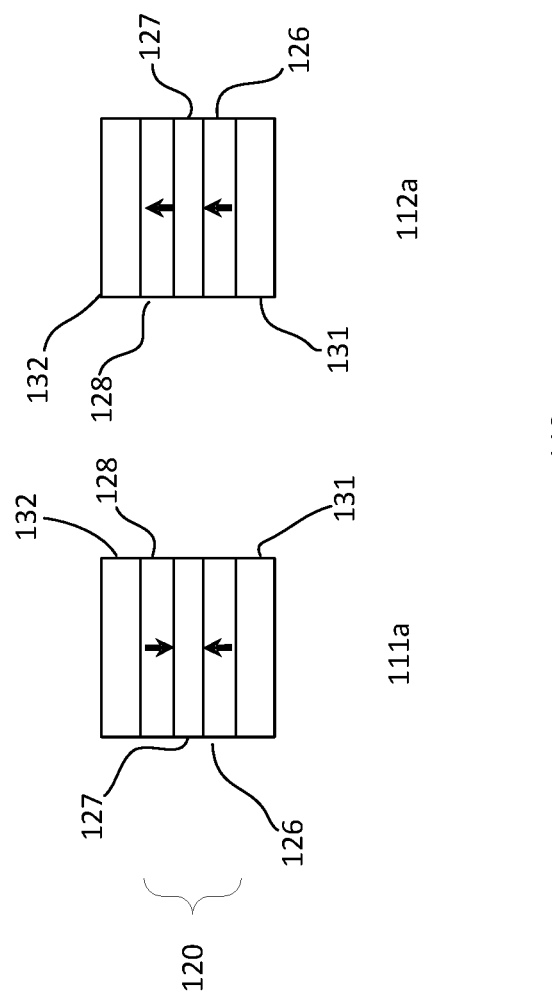

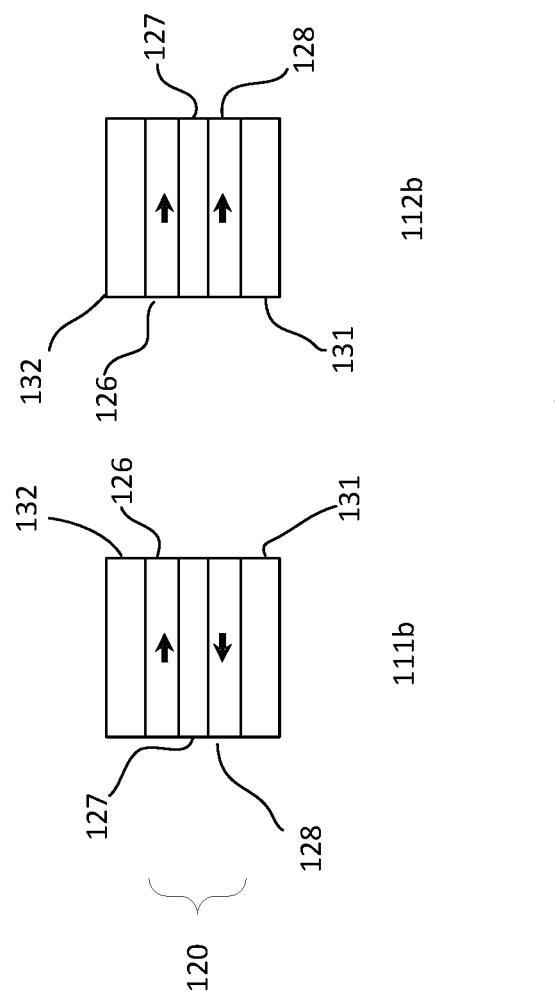

STORAGE LAYER FOR MAGNETIC MEMORY WITH HIGH THERMAL STABILITY

CROSS-REFERENCE TO RELATED APPLICATIONS

This application is a divisional application which claims benefit of co-pending U.S. patent application Ser. No. 15/081,971, filed on Mar. 28, 2016, which claims the priority benefits of U.S. Provisional Application Ser. No. 62/138,984, filed on Mar. 27, 2015 and this application cross-references to U.S. patent application Ser. No. 15/057,107 and U.S. patent application Ser. No. 15/057,109, both filed on Feb. 29, 2016, and U.S. patent application Ser. No. 15/060,634 and U.S. patent application Ser. No. 15/060,647, both filed on Mar. 4, 2016, and further cross-references to U.S. patent application Ser. No. 15/071,180, filed on Mar. 15, 2016 and U.S. patent application Ser. No. 15/075,222, filed on Mar. 21, 2016, the disclosures of which are herein incorporated by reference in their entireties for all purposes.

BACKGROUND

A magnetic memory cell or device stores information by changing electrical resistance of a magnetic tunnel junction (MTJ) element. The MTJ element typically includes a thin insulating tunnel barrier layer sandwiched between a magnetically fixed layer and a magnetically free layer, forming a magnetic tunnel junction. The magnetization of the free layer can switch between first and second magnetization directions while the magnetization direction of the fixed layer is fixed in the first magnetization direction.

An important aspect of MTJ element is to have high thermal stability and low switching current. However, in conventional MTJ elements, tunnel magnetoresistance (TMR) degrades when exposed to high processing temperatures, such as those employed in back-end-of-line (BEOL) complementary metal oxide semiconductor (CMOS) processing. In other words, conventional MTJ elements have low thermal stability.

In view of the foregoing, it is desirable to provide a MTJ element with improved thermal stability as well as low switching current. Furthermore, it is also desirable to provide a process for forming such MTJ elements which is cost effective and compatible with CMOS processing.

SUMMARY

Embodiments of the present disclosure generally relate to semiconductor devices and methods for forming a semiconductor device. In one embodiment, a memory cell is disclosed. The memory cell includes a select unit on a substrate, a dielectric layer on the substrate covering the select unit and a storage unit in the dielectric layer. The storage unit includes a magnetic tunnel junction (MTJ) element disposed between top and bottom electrodes. The MTJ element includes a magnetic fixed layer, a tunneling barrier layer and a composite magnetic free layer. The tunneling barrier layer is disposed between the magnetic fixed layer and the composite magnetic free layer. The composite magnetic free layer includes first and second magnetic free layers separated by an oxide-based insertion layer. Furthermore, the first magnetic free layer is disposed below the second magnetic free layer.

In another embodiment, a magnetic tunnel junction (MTJ) element of a storage unit is presented. The MTJ element includes a magnetic fixed layer, a tunneling barrier layer and a composite magnetic free layer. The tunneling barrier layer is disposed between the magnetic fixed layer and the composite magnetic free layer. The composite magnetic free layer comprises first and second magnetic free layers separated by an oxide-based insertion layer. Furthermore, the first magnetic free layer is disposed below the second magnetic free layer.

In yet another embodiment, a memory cell is disclosed. The memory cell includes a select unit on a substrate, a dielectric layer on the substrate covering the select unit and a storage unit in the dielectric layer. The select unit includes a transistor. The dielectric layer includes a storage pad coupled to a first S/D region of the transistor of the select unit. The storage unit includes a bottom electrode, a top electrode, and a magnetic tunnel junction (MTJ) element disposed between the top and bottom electrode. The MTJ element includes a magnetic fixed layer, a tunneling barrier layer and a composite magnetic free layer. The tunneling barrier layer of the composite magnetic free layer is disposed between the magnetic fixed layer and the composite magnetic free layer. The composite magnetic free layer includes first and second magnetic free layers separated by an insertion layer. The insertion layer includes a base layer which includes Mg or Hf, and wherein the insertion layer ferromagnetically couples the first and second magnetic free layers of the composite magnetic free layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1d show simplified diagrams of MTJ units.

FIG. 6a-6l show cross-sectional views of an embodiment of a process for forming a memory cell.

DETAILED DESCRIPTION

Figure 1B:
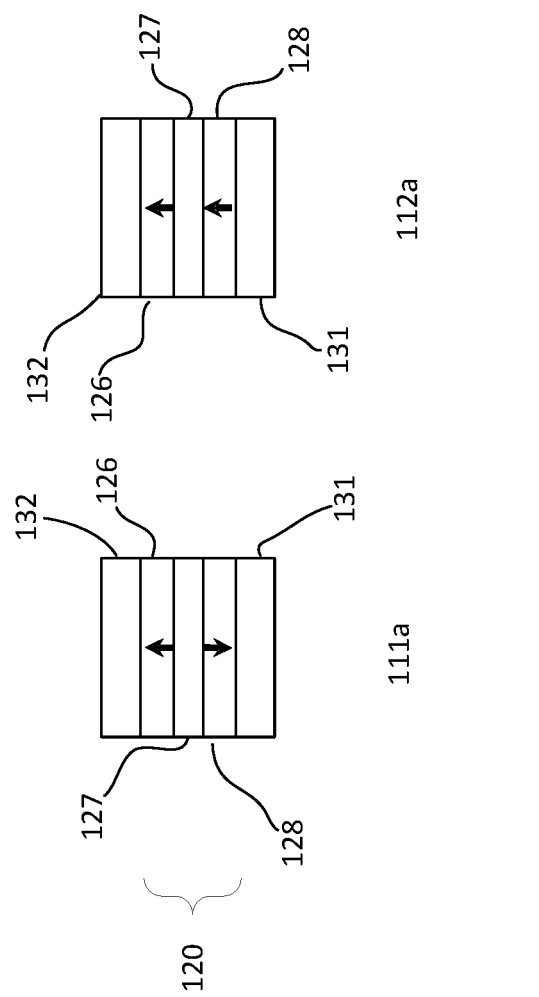

Embodiments of the present disclosure generally relate to memory cells or devices. In one embodiment, the memory cells are magnetoresistive memory cells. For example, the memory devices may be spin transfer torque magnetoresistive random access memory (STT-MRAM) devices. A magnetoresistive memory cell includes a magnetic tunneling junction (MTJ) storage unit. Such memory devices, for example, may be incorporated into standalone memory devices including, but not limited to, Universal Serial Bus (USB) or other types of portable storage units, or integrated circuits (ICs), such as microcontrollers or system on chips (SoCs). The devices or ICs may be incorporated into or used with, for example, consumer electronic products, or relate to other types of devices.

FIG. 1a shows a simplified cross-sectional view of an embodiment of a MTJ unit 110a. The MTJ unit, for example, may be used as a storage unit of a magnetic memory cell. Other applications for the MTJ unit may also be useful. The MTJ unit includes a MTJ element or stack 120 disposed between first and second electrodes 131 and 132. The first electrode may be a bottom electrode while the second electrode may be a top electrode. The bottom electrode, for example, is proximate to the substrate on which the memory cell is formed while the top electrode is distal from the substrate.

The MTJ element includes a magnetically fixed layer 126, a tunneling barrier layer 127 and a magnetically free layer 128. As shown, the magnetic orientation of the magnetic layers is in a perpendicular direction. The perpendicular direction, for example, refers to the direction which is perpendicular to the surface of a substrate or perpendicular to the plane of the layers of the MTJ element. In one embodiment, the magnetically fixed layer is disposed below the magnetic free layer, forming a bottom pinned perpendicular MTJ (pMTJ) element. The perpendicular direction of the fixed layer is in a first perpendicular direction. The first perpendicular direction is shown to be in an upward direction away from the substrate. Providing the first perpendicular direction which is in a downward direction towards the substrate may also be useful. As for the magnetic orientation of the free layer, it may be programmed to be in a first or same (parallel) direction as the fixed layer or in a second or opposite (antiparallel) direction as the fixed layer.

For example, the fixed layer is the layer with a magnetically hard or fixed orientation which does not switch except if a very high field is applied. The free layer or the storage layer is the layer whose magnetic orientation switches from one direction to the other by applying field or current. The field or current is less than that which makes the hard layer switches its magnetic orientation. As shown by structure 111a, the magnetic direction of the free layer is programmed to be in the second or anti-parallel direction to the fixed layer. The corresponding MTJ electrical resistance between the free layer 128 and the fixed layer 126 is denoted as $R_{AP}$. Structure 112a illustrates that the magnetization of the free layer is programmed to be in the first or parallel direction to the fixed layer. The corresponding MTJ electrical resistance between the free layer 128 and the fixed layer 126 is denoted as $R_P$. The resistance $R_{AP}$ is higher than the resistance $R_P$. For example, when the magnetization of free and fixed layers is parallel, they represent low resistance. Conversely, when the magnetization of the free and fixed layers is antiparallel, they represent high resistance.

FIG. 1b shows a MTJ unit 110b, which is similar to the storage unit 110a of FIG. 1a. Common elements may not be described or described in detail.

The storage unit includes a pMTJ element 120 disposed between a bottom electrode 131 and a top electrode 132. The pMTJ element includes a magnetically fixed layer 126, a tunneling barrier layer 127 and a magnetically free layer 128. The fixed layer is disposed above the free layer, forming a top pinned pMTJ element.

Figure 1C:
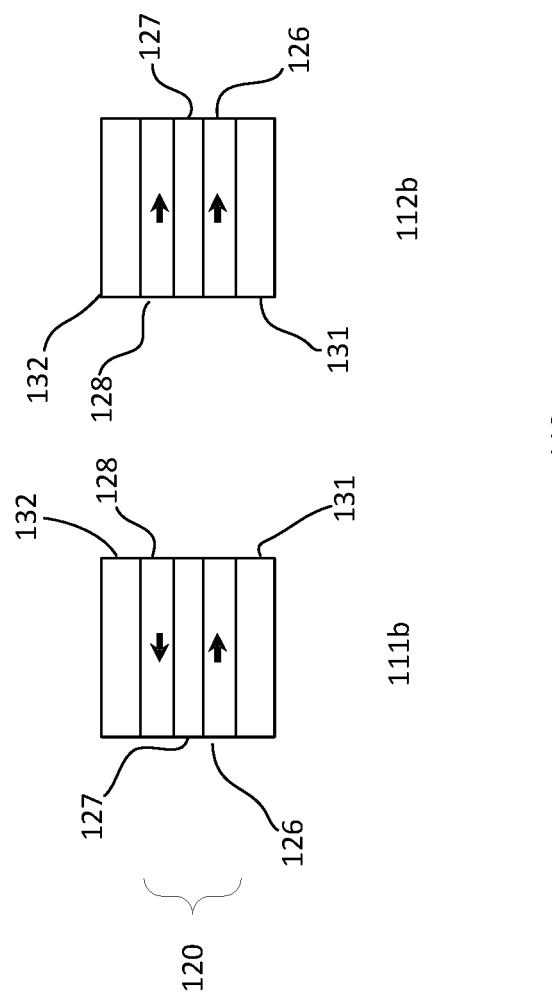

FIG. 1c shows a MTJ unit 110c, which is similar to the MTJ unit 110a of FIG. 1a. Common elements may not be described or described in detail.

The MTJ unit includes a MTJ element 120 disposed between a bottom electrode 131 and a top electrode 132. The MTJ element includes a magnetically fixed layer 126, a tunneling barrier layer 127 and a magnetically free layer 128. As shown, the magnetization directions of the various layers are in the horizontal or in-plane direction. The term horizontal direction, for example, refers to the direction which is parallel or in plane with the surface of a substrate. In one embodiment, the fixed layer is disposed below the magnetic free layer, forming a bottom pinned in-plane MTJ (iMTJ) element. As for the magnetic orientation of the free layer, it may be programmed to be in a first or same horizontal direction as the fixed layer or in a second or opposite horizontal direction as the fixed layer.

For example, as shown by structure 111b, the magnetic direction of the free layer is programmed to be in the second or anti-parallel direction to the fixed layer. The corresponding MTJ electrical resistance between the free layer 128 and the fixed layer 126 is denoted as $R_{AP}$. Structure 112b illustrates that the magnetization of the free layer is programmed to be in the first or parallel direction to the fixed layer. The corresponding MTJ electrical resistance between the free layer 128 and the fixed layer 126 is denoted as $R_P$. The resistance $R_{AP}$ is higher than the resistance $R_P$.

FIG. 1d shows a MTJ storage unit 110d, which is similar to the storage unit 110c of FIG. 1c. Common elements may not be described or described in detail.

The storage unit includes an iMTJ element 120 disposed between a bottom electrode 131 and a top electrode 132. The iMTJ element includes a magnetically fixed layer 126, a tunneling barrier layer 127 and a magnetically free layer 128. The fixed layer is disposed above the free layer, forming a top pinned iMTJ element.

Figure 2:
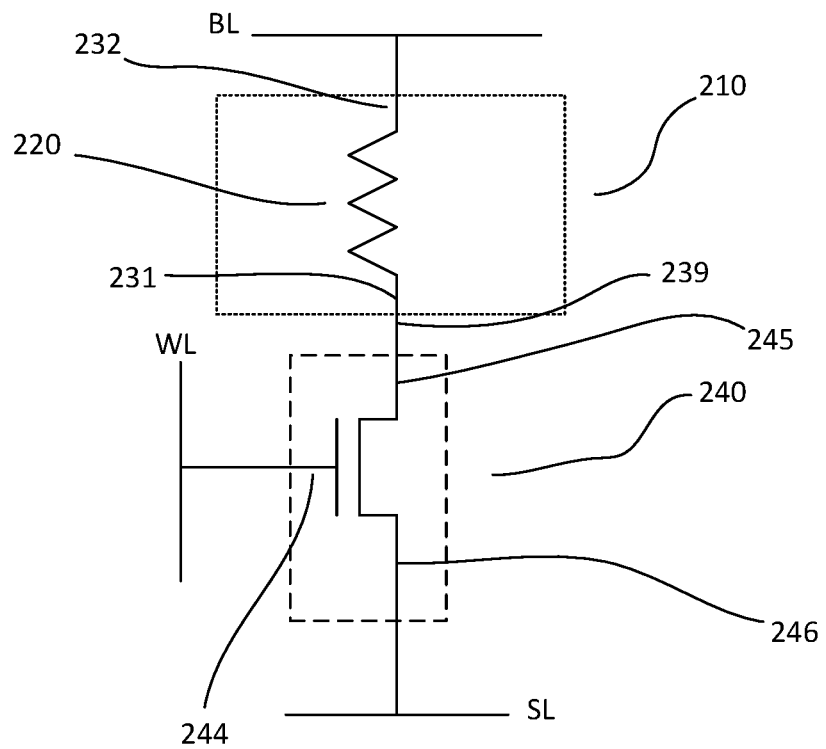
FIG. 2 shows a schematic diagram of an embodiment of a magnetic memory cell.

FIG. 2 shows a schematic diagram of an embodiment of a memory cell 200. The memory cell is a non-volatile memory cell. For example, the memory cell may be a magnetoresistive memory cell. In one embodiment, the memory cell is a Spin Transfer Torque-Magnetoresistive Random Access Memory (STT-MRAM) cell. Other suitable types of memory cells may also be useful. The memory cell includes a magnetic storage unit 210 and a cell selector unit 240. The storage unit is coupled to the cell selector unit. For example, the storage unit and cell selector unit are coupled at a first cell node 239 of the memory cell. The storage unit 210, in one embodiment, is a magnetic storage unit and includes a MTJ element 220. The MTJ element may be a bottom pinned pMTJ element, a top pinned pMTJ element, a bottom pinned iMTJ element or a top pinned iMTJ element, as described in FIGS. 1a-1d. Other suitable types of MTJ elements may also be useful.

The MTJ element includes first and second electrodes 231 and 232. The first electrode, for example, may be a bottom electrode while the second electrode may be a top electrode. Other configurations of electrodes may also be useful. In one embodiment, the top electrode of the storage unit is electrically connected to a bit line (BL). The bottom electrode of the storage element is connected to the first cell node 239.

The cell selector unit includes a selector for selecting the memory cell. The selector, for example, may be a select transistor. In one embodiment, the select transistor is a metal oxide semiconductor (MOS) transistor. In one embodiment the selector is a n-type MOS transistor. The select transistor includes first and second source/drain (S/D) terminals 245 and 246 and a gate or control terminal 244. The first S/D terminal may be referred to as a drain and the second S/D terminal may be referred to as the source. The S/D terminals, for example, are heavily doped regions with first polarity type dopants, defining the first type transistor. For example, in the case of a n-type transistor, the S/D terminals are n-type heavily doped regions. Other types of transistors or selectors may also be useful.

In one embodiment, the first terminal of the cell selector and first electrode of the storage unit are commonly coupled at the first cell node. For example, the first S/D terminal of the cell selector is coupled to the bottom electrode of the storage unit. For example, the drain terminal is coupled to the storage unit. The second or source terminal of the cell selector is coupled to a source line (SL). As for the gate terminal, it is coupled to a wordline WL.

Figure 3:
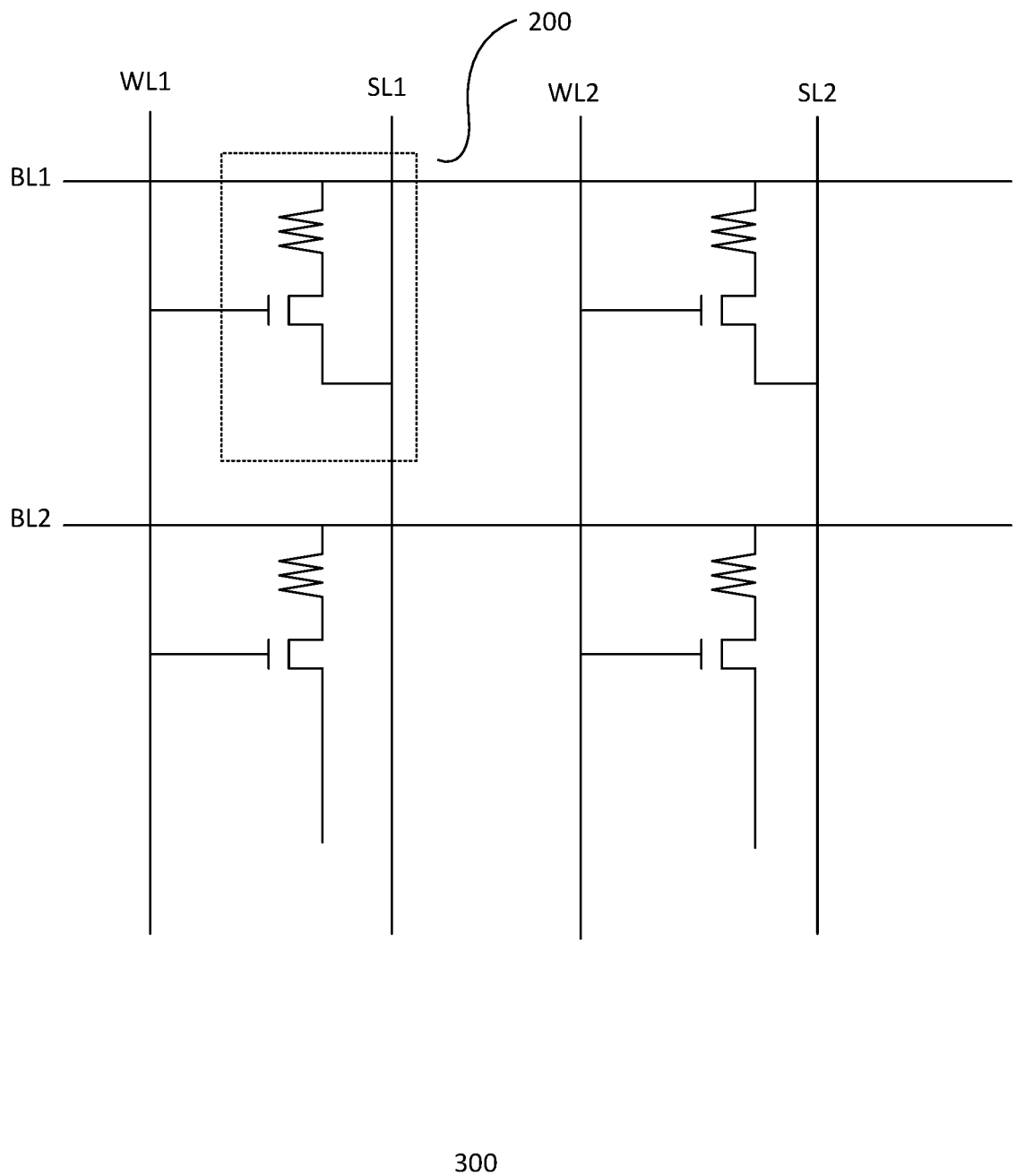
FIG. 3 shows an array of magnetic memory cells.

FIG. 3 shows a schematic diagram of an embodiment of a memory array 300. The array includes a plurality of memory cells 200 interconnected. The memory cells may be similar to those described in FIG. 2. For example, the memory cells are MRAM cells, such as STT-MRAM cells. Common elements may not be described or described in detail. Other suitable types of memory cells may also be useful.

As shown, the array includes four memory cells arranged in a 2×2 array. For example, the array is arranged to form two rows and two columns of memory cells. Memory cells of a row are interconnected by a wordline (WL1 or WL2) while memory cells of a column are interconnected by a bitline (BL1 or BL2). A second S/D or source terminal is coupled to a source line (SL1 or SL2). As shown, the SLs are in the row or wordline direction. Other suitable cell configurations may also be useful. Although the array is illustrated as a 2×2 array, it is understood that arrays of other sizes may also be useful.

Figure 4:
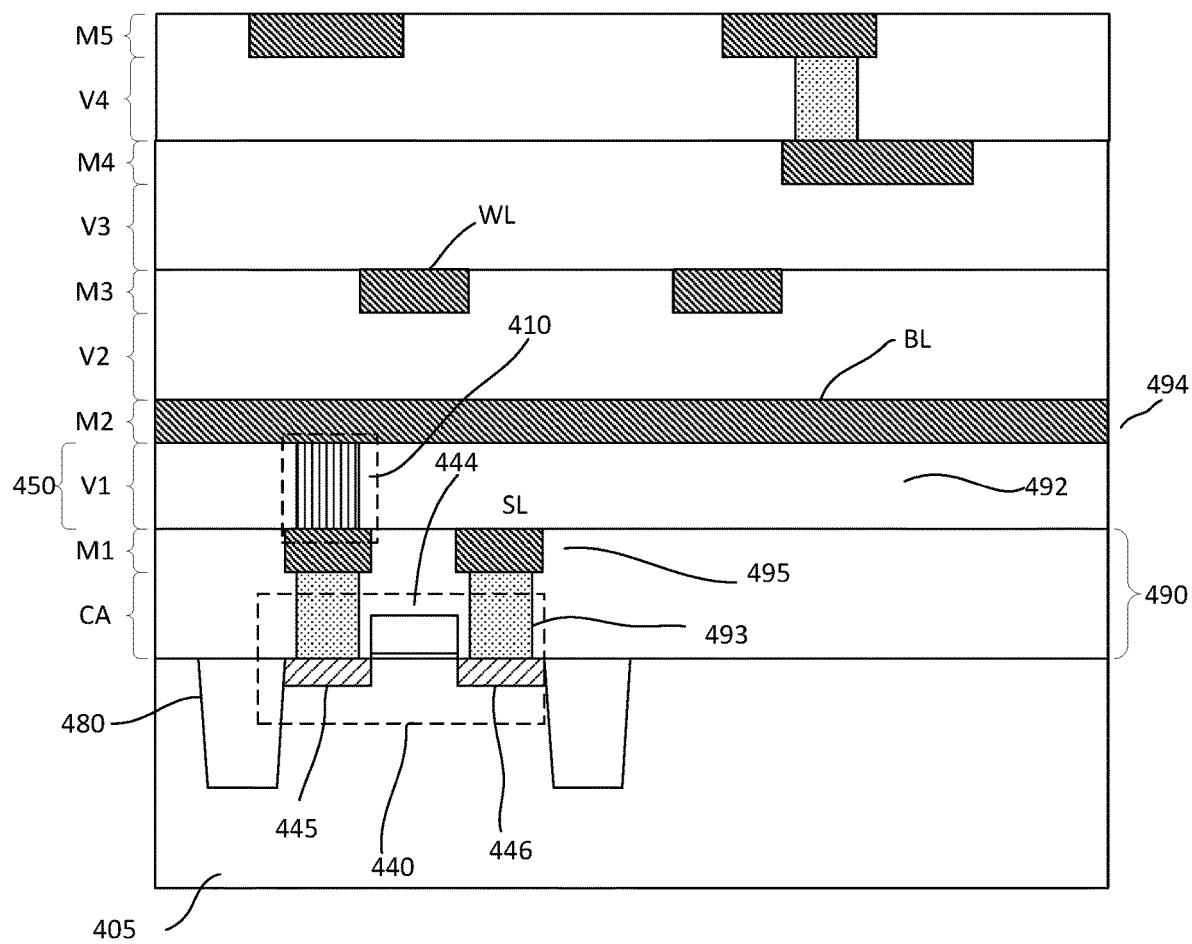
FIG. 4 shows a cross-sectional view of an embodiment of a memory cell.

FIG. 4 shows a cross-sectional view of an exemplary embodiment of a device. The cross-sectional view, for example is along a second or bitline direction of the device. The device, as shown, includes a memory cell 400. The memory cell, for example, may be a NVM memory cell. The memory cell, in one embodiment, is a magnetoresistive non-volatile memory (NVM) cell, such as a STT-MRAM cell. The memory cell, for example, is similar to that described in FIG. 2. Common elements may not be described or described in detail.

The memory cell is disposed on a substrate 405. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front-end-of-line (FEOL) processing is performed on the substrate. The FEOL process, for example, forms n-type and p-type devices or transistors on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

Isolation regions 480, for example, serve to isolate different device regions. The isolation regions may be shallow trench isolation (STI) region. To form STI regions, trenches are formed and filled with isolation material. A planarization process, such as chemical mechanical polishing (CMP) is performed to remove excess dielectric material, forming isolation regions. Other types of isolation regions may also be useful. The isolation regions are provided to isolate device regions from other regions.

Device wells (not shown), for example, serve as bodies of p-type and n-type transistors. Device wells are doped wells. Second type doped device wells serve as bodies of first type transistors. For example, p-type device wells serve as bodies of n-type transistors and n-type device wells serve as bodies of p-type transistors. Isolation wells may be used to isolate device wells from the substrate. The isolation wells are deeper than the device wells. For example, isolation wells encompass the device wells. The isolation wells are first type doped wells. For example, n-type isolation wells are used to isolate p-type device wells. Separate implants may be employed to form different doped device wells and isolation wells using, for example, implant masks, such as photoresist masks. The wells, for example, are formed after forming isolation regions.

Gates of transistors are formed on the substrate. For example, layers of the gate, such as gate dielectric and gate electrode are formed on the substrate and patterned to form the gates. The gate dielectric may be a silicon oxide layer while the gate electrode layer may be polysilicon. The gate electrode may be doped, for example, to reduce sheet resistance. Other types of gate dielectric and gate electrode layers may also be useful. The gate dielectric layer may be formed by thermal oxidation and the gate electrode layer may be formed by chemical vapor deposition (CVD). Separate processes may be performed for forming gate dielectrics of the different voltage transistors. This is due to, for example, different gate dielectric thicknesses associated with the different voltage transistors. For example, HV transistor will have a thicker gate dielectric than a LV transistor.

The gate layers are patterned by, for example, mask and etch techniques. For example, a patterned photoresist mask may be provided over the gate layers. For example, a photoresist layer is formed over the gate layers and lithographically exposed by using a reticle. The mask layer is developed, forming a patterned mask with the desired pattern of the reticle. To improve lithographic resolution, an anti-reflective coating (ARC) layer may be provided between the gate layer and resist mask layer. An anisotropic etch, such as a reactive ion etch (RIE) is used to pattern the gate layers to form the gates using the patterned mask layer.

Doped contact regions 445 and 446, such as source/drain (S/D) regions and well or substrate taps are formed in exposed active regions of the substrate after forming the gates. The contact regions are heavily doped regions.

Depending on the type of transistor and well tap, the contact regions may be heavily doped n-type or p-type regions. For n-type transistors, the S/D regions are heavily doped n-type regions and for p-type transistors, the S/D regions are heavily doped p-type regions. For well taps, they are the same dopant type as the well.

A S/D region may include lightly doped diffusion (LDD) and halo regions (not shown). A LDD region is a lightly doped region with first polarity type dopants while the halo region is a lightly doped region with second polarity type dopants. For example, the halo region includes p-type dopants for a n-type transistor while the LDD region includes n-type dopants for n-type transistors. The halo and LDD regions extend under the gate. A halo region extends farther below the gate than a LDD region. Other configurations of LDD, halo and S/D regions may also be useful.

Dielectric spacers (not shown) may be provided on the gate sidewalls of the transistors. The spacers may be used to facilitate forming transistor halo, LDD and transistor S/D regions. For example, spacers are formed after halo and LDD regions are formed. Spacers may be formed by, for example, forming a spacer layer on the substrate and anisotropically etching it to remove horizontal portions, leaving the spacers on sidewalls of the gates. After forming the spacers, an implant is performed to form the S/D regions. Separate implants may be employed to form different doped regions using, for example, implant masks, such as photoresist mask. Well taps of the same dopant type as the S/D regions are formed at the same time.

As shown, the FEOL processing forms a cell region isolated by an isolation region 480, such as a STI region. The cell region is for a memory cell. Isolation regions may be provided to isolate columns of memory cells. Other configurations of isolation regions may also be useful. The cell region may include a cell device well (not shown). The cell device well, for example, serves as a body well for a transistor of the memory cell. The device well may be doped with second polarity type dopants for first polarity type transistors. The device well may be lightly or intermediately doped with second polarity type dopants. In some cases, a cell device isolation well (not shown) may be provided, encompassing the cell device well. The isolation well may have a dopant type which has the opposite polarity to that of the cell device well. For example, the isolation well may include first polarity type dopants. The isolation well serves to isolate the cell device well from the substrate. Well biases may be provided to bias the wells.

The cell device well may be a common well for the cell regions in the array region. For example, the cell device well may be an array well. The cell device isolation well may serve as the array isolation well. Other configurations of device and isolation wells may also be useful. Other device regions of the device may also include device and/or device isolation wells.

The memory cell includes a cell selector unit 440 and a storage unit 410. The FEOL processing forms the cell selector in the cell region. The cell selector unit includes a selector for selecting the memory cell. The selector, for example, may be a select transistor. In one embodiment, the select transistor is a metal oxide semiconductor (MOS) transistor. The transistor, as shown, includes first and second source/drain (S/D) regions 445 and 446 formed in the substrate and a gate 444 disposed on the substrate between the S/D regions. The first S/D region may be referred to as a drain region and the second S/D region may be referred to as a source region. The S/D regions, for example, are heavily doped regions with first polarity type dopants, defining the first type transistor. For example, in the case of a n-type transistor, the S/D regions are n-type heavily doped regions. Other types of transistors or selectors may also be useful.

As for the gate 444, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a first or wordline direction. The gate conductor forms a common gate for a row of memory cells.

As discussed, a S/D region may include LDD and halo regions (not shown). Dielectric spacers (not shown) may be provided on the gate sidewalls of the transistors to facilitate forming transistor halo, LDD and transistor S/D regions. It is understood that not all transistors include LDD and/or halo regions.

After forming the cell selector unit and other transistors, back-end-of-line (BEOL) processing is performed. The BEOL process includes forming interconnects in interlevel dielectric (ILD) layers 490. The interconnects connect the various components of the IC to perform the desired functions. An ILD layer includes a metal level 494 and a contact level 492. Generally, the metal level includes conductors or metal lines 495 while the contact level includes contacts 493. The conductors and contacts may be formed of a metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$ where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical polishing (CMP), is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The upper dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 dielectric. The first metal level M1 and CA may be referred as a lower ILD level.

The process continues to form additional ILD layers. For example, the process continues to form upper ILD layers or levels. The upper ILD levels may include ILD level 2 to ILD level x. For example, in the case where x=5 (5 levels), the upper levels include ILD levels from 2 to 5, which include via levels V1 to V4 and metal levels M2 to M5. The number of ILD layers may depend on, for example, design requirements or the logic process involved. The upper ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an upper ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD which is 2× or 6× the CD of the metal levels below. Other configurations of the ILD levels may also be useful.

As shown, S/D contacts are disposed in the CA level. The S/D contacts are coupled to the first and second S/D regions of the select transistor. Other S/D contacts to other S/D regions of transistors may also be provided. The CA level may include a gate contact (not shown) coupled to the gate of the select transistor. The gate contact may be disposed in another cross-section of the device. The contacts may be tungsten contacts while contact pads may be copper. Other types of contacts and contact pad may also be useful. Other S/D and gate contacts for other transistors may also be provided.

As described, metal lines are provided in M1. The metal lines are coupled to the S/D contacts. In one embodiment, a SL is coupled to the second S/D region of the select transistor. As for the first S/D region, it may be coupled to a contact pad or island in M1. The contact pads provide connections to upper ILD levels. The metal lines or contact pads may be formed of copper or copper alloy. Other types of conductive material may also be useful.

As for the upper ILD levels, for example, from 2 to 5, they include contacts in the via level and contact pads/metal lines in the metal level. The contacts and contact pads provide connection from M5 to the first S/D region of the select transistor.

A pad level (not shown) is disposed over the uppermost ILD level. For example, a pad dielectric level is disposed over Mx. In the case where the device includes 5 metal levels, the pad level is disposed over M5. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

A dielectric liner may be disposed between the uppermost metal level and pad level. The dielectric liner, for example, serves as an etch stop layer during via etch process and it may also serve as a diffusion barrier layer for, for example, copper (Cu) layer. The dielectric liner may be a low k dielectric liner. For example, the dielectric liner may be nBLOK. Other suitable types of dielectric materials for the dielectric liner may also be useful.

The storage unit 410 of the memory cell is disposed in a storage dielectric layer 450. The storage dielectric layer may be a via level of an ILD level. As shown, the storage dielectric layer is V1 of M2. Providing the storage dielectric layer at other via levels may also be useful. In other embodiments, the storage dielectric layer may be a dedicated storage dielectric layer and not part of an interconnect level. Other configurations of storage dielectric layer may also be useful. The storage unit 410 includes a storage element disposed between top and bottom electrodes, forming a pMTJ element. The storage element, in one embodiment, is a bottom pinned MTJ storage element, such as that described in FIG. 1a or FIG. 1c and FIGS. 5a-5b as will be described later. Common elements may not be described or described in detail. In other embodiments, the MTJ element may be a top pinned MTJ storage element, such as that described in FIG. 1b or FIG. 1d and FIGS. 5c-5d. The top pinned or bottom pinned storage element may be pMTJ or iMTJ storage element. Other configurations of MTJ elements may also be useful.

In one embodiment, the bottom electrode of the storage unit is coupled to a drain of the select transistor. For example, the bottom electrode is coupled to a contact pad in the M1 level and a via contact in the CA level. Other configurations of coupling the bottom electrode may also be useful. The top electrode is coupled to a BL. For example, the top electrode is coupled to the BL disposed in M2. The BL is along a bitline direction. As for the source of the select transistor, it is coupled to the SL. The SL, for example, may be in the first or wordline direction. Providing a SL in the second or bitline direction may also be useful. For example, a via contact in CA is provided to couple the source region to SL in M1. Providing SL in other levels may also be useful.

As for the gate of cell selector, it is coupled to a WL. The WL, for example, is along a wordline direction. The bitline and wordline directions are perpendicular to each other. As shown, the WL is disposed in M3. The WL may be coupled to the gate by contact pads in M2 and M1 and via contacts in V2 and V1 (not shown). Other configurations of coupling the WL to the gate may also be useful. For example, the WL may be disposed in other metal levels.

In general, lines which are parallel in a first direction may be formed in the same metal level while lines which are in a second direction perpendicular to the first may be formed in a different metal level. For example, WLs and BLs are formed in different metal levels.

As described, the storage dielectric layer 450 is disposed in V1 in between M1 and M2. It is understood that providing other configurations of storage dielectric layers may be also useful.

Figure 5A:
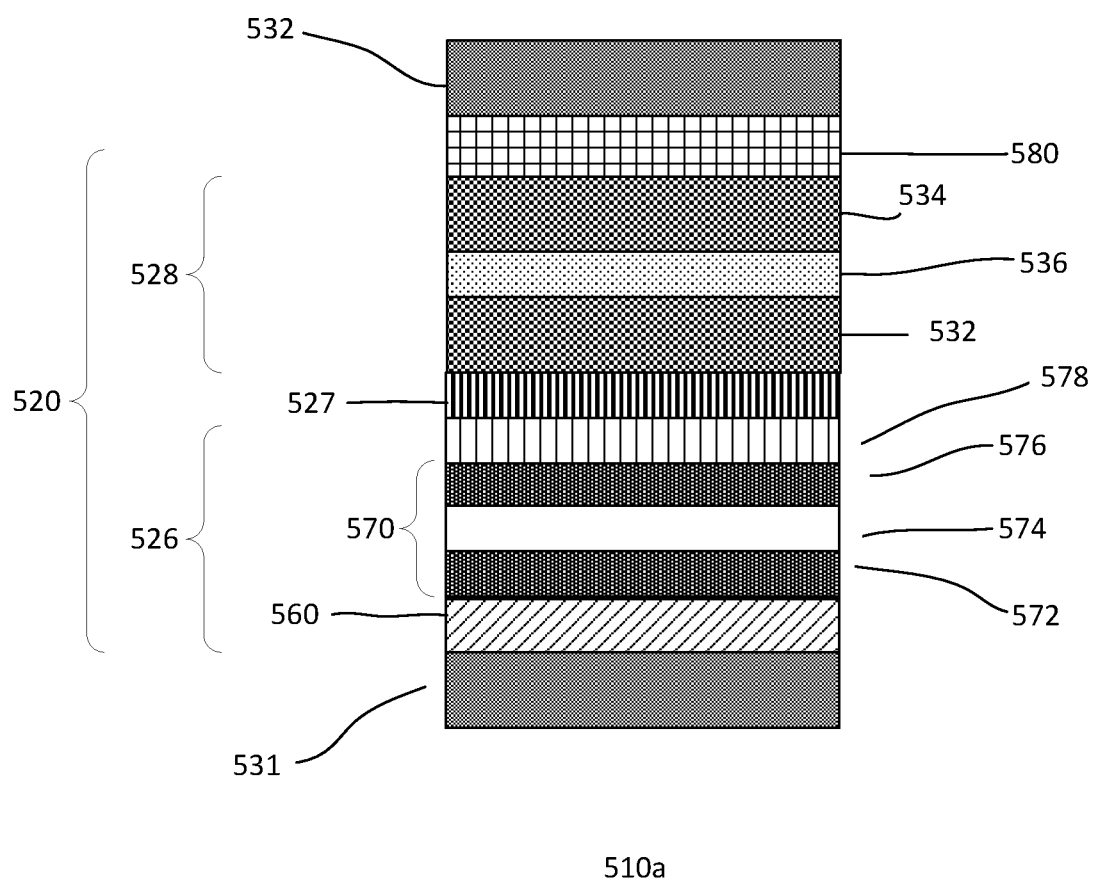
FIGS. 5a-5d show cross-sectional views of embodiments of MTJ units.

FIG. 5a shows a cross-sectional view of an embodiment of a MTJ unit 510a. The MTJ unit, for example, is a storage unit of a magnetic memory cell. Providing the MTJ unit for other types of devices may also be useful. In one embodiment, the MTJ unit includes a bottom pinned MTJ stack or element 520 disposed between bottom and top electrodes 531 and 532. The MTJ element or stack includes a fixed layer 526, a free layer 528, and a tunneling barrier layer 527 between them. In one embodiment, the MTJ element is a pMTJ element. For example, the magnetization direction of the magnetic layers is in the perpendicular direction. Alternatively, the MTJ element may be an iMTJ element. For example, the magnetization direction of the magnetic layers is in the horizontal or in-plane direction. The fixed layer, tunneling barrier layer and the free layer form the MTJ element 520. A capping layer 580 may be disposed over the free layer. As shown, the fixed layer is disposed below the free layer, forming a bottom pinned MTJ element, such as a bottom pinned pMTJ element or a bottom pinned iMTJ element.

The top and bottom electrode layers may be formed of a conductive material. In one embodiment, the top and bottom electrodes may be formed of Ta. Other suitable types of electrodes may also be useful. For example, Ti, TaN, TiN or a combination of different electrode materials, including Ta, may also be useful. Furthermore, it is understood that the top and bottom electrodes need not be of the same material. A thickness of the electrode layers may be about 1 to 100 nm. The electrodes may be formed by physical vapor deposition (PVD). Other deposition techniques may also be useful.

The various layers of the MTJ element will be described. For example, the various layers will be described from the bottom electrode up to the top electrode for a bottom pinned MTJ element.

In one embodiment, the fixed layer is disposed on the bottom electrode. The fixed layer is a fixed layer stack which includes a base layer 560, a hard layer 570 and a reference layer 578. Providing the fixed layer with other layers may also be useful. For example, other configurations of a fixed layer may also be useful.

The base layer, for example, serves as a seed layer. The seed layer serves as a base for the hard layer. For example, the seed layer provides a proper template for magnetic layer to form proper crystalline phase after annealing. In one embodiment, the seed layer may be Ta or Pt or any combination of metal multilayers. Other suitable types of seed layers may also be useful. In one embodiment, the base layer may be a composite seed layer having multiple layers. For example, the base layer may include a wetting layer and a seed layer over it. The seed layer includes multiple layers, such as a bilayer. The seed layer may include multiple bilayers. The base layer may be a base layer as described in, for example, U.S. patent application Ser. No. 15/057,107 and U.S. patent application Ser. No. 15/057,109, both filed on Feb. 29, 2016, which are herein incorporated by references for all purposes. The base layer may be formed by PVD.

The hard layer 570 serves to pin the reference layer. The hard layer, for example, may be a single layer. For example, the hard layer may be an alloy layer, such as, FePt or CoPt. Alternatively, the hard layer may be a multilayered hard layer. For example, the hard layer may be a Co/Pt, Co/Ni or Co/Pd bilayer. In yet other embodiment, the hard layer may include multiple bilayers. For example, the hard layer may include $(Co/Pt)_n$, $(Co/Ni)_n$ or $(Co/Pd)_n$, where n is the number of bilayers greater than or equal to 1. Other types of hard layers may also be useful. In some cases, the hard layer may be a bilayer.

The hard layer, in other embodiments, may be a SAF layer. The SAF layer is a composite SAF layer with multiple layers to form a SAF layer stack. In one embodiment, the SAF layer includes first and second hard layers 572 and 576 separated by a coupling layer 574. The first and second hard layers are antiparallel (AP) layers. The first AP layer may be referred to as AP1 and the second AP layer may be referred to as AP2. AP1 and AP2 have opposite perpendicular magnetization directions. For example, AP1 may have an upward perpendicular magnetization direction while AP2 may have a downward perpendicular magnetization direction for a pMTJ element. In the case of an iMTJ element, the magnetization direction of AP1 may be in a first horizontal direction while the magnetization direction of AP2 may be in a second horizontal direction which is opposite to the first horizontal direction. For example, the magnetization direction of AP1 may be to the right and the magnetization direction of AP2 may be to the left. Other configurations of opposite magnetization directions for AP1 and AP2 may also be useful.

An AP layer may be a bilayer. In one embodiment, the AP layer may be multilayers of cobalt/platinum (Co/Pt), cobalt/nickel (Co/Ni) or cobalt/palladium (Co/Pd). Other types of AP layers may also be useful. The bilayers of AP1 and AP2 may be the same type of bilayers. Providing different bilayers for AP1 and AP2 may also be useful.

As for the coupling layer, it serves to promote Ruderman-Kittle-Kasuya-Yosida (RKKY) coupling. The coupling layer, in one embodiment, is a ruthenium (Ru) layer. Providing other types of coupling layers may also be useful.

The hard layer may be about 4-8 Å thick. For example, in the case of multiple layers, the total thickness of the hard layer may be about 4-8 Å. Providing the hard layer having other thicknesses may also be useful. The hard layer or various layers of the hard layer may be formed by, for example, PVD. Other deposition techniques may also be useful.

A spacer layer (not shown) may be provided between the second AP layer 576 and reference layer 578. The spacer layer, for example, serves as a texture breaking layer. The spacer layer facilitates a different texture for the reference layer. For example, the spacer layer enables the reference layer to have a different texture from that of the SAF or hard layer. For example, the spacer layer enables the reference layer to be amorphous or crystalline when deposited. In one embodiment, the spacer layer facilitates the reference layer to achieve a desired crystalline structure or orientation. The spacer layer, for example, may be a Mo-based, Ta-based, or W-based composite spacer layer. In some embodiments, the spacer layer may be magnetically continuous spacer layers, such as CoFeB/Ta, CoFeB/Mo or CoFeB/W. Other types of spacer layers may also be useful. For example, the spacer layer may be a composite spacer layer as described in U.S. patent application Ser. No. 15/071,180, filed on Mar. 15, 2016, which is herein incorporated by reference for all purposes. For example, the spacer layer may additionally serve as a diffusion barrier between the reference and SAF layers.

The reference layer 578, in one embodiment, is a magnetic layer. The reference layer, for example, is a cobalt-iron-boron (CoFeB) layer. Other suitable types of magnetic reference layers may also be useful. In one embodiment, the reference layer is deposited by, for example, PVD. The reference layer is deposited as an amorphous layer. Depositing the layer as an amorphous layer enhances TMR when it is subsequently recrystallized. For example, a post anneal is performed on the MTJ stack. The reference layer should be sufficiently thick without sacrificing perpendicular magnetic anisotropy (PMA). The thickness of the reference layer, for example, may be about 5-13 Å thick. Forming the reference layer using other suitable techniques or processes as well as other suitable thicknesses may also be useful.

The tunneling barrier layer 527 which is disposed over the fixed layer may be a magnesium oxide (MgO) layer. Other suitable types of barrier layers may also be useful. The tunneling barrier layer may be formed by PVD. The thickness of the tunneling barrier layer may be about 8-20 Å. Preferably, the thickness of the tunneling barrier layer is about 1-12 Å. Other forming techniques or thicknesses for the tunneling barrier layer may also be useful.

The free or storage layer 528 is disposed over the tunneling barrier layer 527. In one embodiment, the free layer is a composite free layer. The composite free layer includes an insertion layer 536 sandwiched by first and second free layers 532 and 534. For example, the insertion layer is disposed between first and second free layers. In one embodiment, a free layer of the composite free layer includes ferromagnetic layers. For example, a free layer may be a CoFeB layer. Other types of ferromagnetic layers, such as CoFe or FeB may also be useful. It is understood that the first and second free layers need not be the same.

In some cases, a free layer may include a plurality of ferromagnetic layers. For example, a free layer of the composite free layer may include first and second ferromagnetic layers, such as a ferromagnetic bilayer. Bilayers may include, for example, Fe/CoFeB, CoFe/CoFeB or FeB/CoFe. Other types of bilayers or composite layers may also be useful. For example, the free layer may be Fe/$Co_zFe_yB_x$/CoFeB. For example, the first and second CoFeB layers have different compositions. It is understood that the free layers of the composite free layer need not be the same.

The total thickness $T_F$ of the free layers of the composite free layer may be about 7-30 Å. The thickness should avoid sacrificing PMA. Other thicknesses for the free layers of the composite free layer may also be useful. The total thickness $T_F$, for example, is equal to about $t_{F1}+t_{F2}$. The thickness of the free layers of the composite free layer may be distributed evenly between about the first and second free layers. In such case $t_{F1}$ is equal to about $t_{F2}$. For example, a thickness of a free layer ($t_{F1}$ or $t_{F2}$) is equal to about $T_F/2$. Providing free layers of the composite free layer having different thicknesses may also be useful.

As for the insertion layer, it includes an oxide-based insertion ($I_{OB}$) layer. The $I_{OB}$ layer is disposed or formed on the first free layer, separating it from the second free layer. The $I_{OB}$ layer may be a single or a composite layer. For example, the $I_{OB}$ layer may be a B/Y layer, where B is a base layer and Y is a surface layer of the composite $I_{OB}$ layer. In the case where the $I_{OB}$ layer is a single layer, it only contains the base layer B while the surface layer Y is equal to nothing or null. For example, the $I_{OB}$ layer may be B/null or B/Y.

In one embodiment, the base layer is an oxide layer disposed between the first and second free layers. For example, the base layer B may be an oxide layer O provided between the first and second free layers. The oxide layer may be formed by lightly oxidizing the surface of the first free layer prior to forming the second free layer. The thickness of the base layer B is sufficiently thin to maintain magnetic coupling between the free layers. For example, the oxide base layer should be less than one monolayer. For example, the oxide base layer may be about 2-8 Å thick. This also avoids over-oxidizing the free layers, converting them into a non-magnetic layer. In one embodiment, the oxidation is performed using low oxygen flow rate for a short period of time. For example, the flow rate may be from about 0.02-20 sccm for a duration of about 2-200 seconds.

In another embodiment, the base layer B is an oxidized layer. For example, the base layer B may be an oxidized layer XO, where X is the base layer which is oxidized to form XO. In one embodiment, the base layer X of the oxidized layer improves PMA. The base layer also improves ferromagnetic coupling between the free layers. In one embodiment, X is a Mg layer which is oxidized to form MgO. Other types of base layers which improves PMA may also be used. For example, X may be an oxidized Hf layer, forming $HfO_x$. The thickness of the XO layer should be less than one monolayer. For example, XO is about 0.2-0.5 nm thick.

The XO layer may be formed by PVD. The PVD may employ a XO target. Alternatively, a X target may be used. In such case, oxidation may be provided by natural or radical oxidation. For example, in the case of a XO layer which is MgO, a MgO target may be used to form MgO. Alternatively, a Mg target may be used with natural oxidation (NOx) or by Mg radical oxidation to form MgO. In the case of $HfO_x$, a HfO target or a Hf target may be used along with natural or Hf radical oxidation.

In one embodiment, the XO layer is deposited to an initial thickness. The initial thickness, for example, may be about 1 nm. The thickness of the XO layer is reduced by, in one embodiment, plasma etch treatment to a desired thickness. The desired thickness, for example, is 0.2-0.5 nm, which is below one monolayer. The plasma treatment, for example, improves surface smoothness.

A surface layer may be provided over base layer B and below the second free layer. The surface layer may serve as a spacer layer. The spacer layer, for example, getters dopants from the base layer. For example, the spacer layer absorbs excess oxygen from the oxide or oxidized base layer. The spacer layer may also absorb other types of dopants. For example, in the case of CoFeB free layers, it can absorb B atoms of the free layers. The surface layer further enhances PMA, improving TMR and thermal endurance.

In one embodiment, the spacer layer includes a Ta layer. Other types of spacer layers may also be useful. For example, spacer layers such as Ti or Hf may also be useful. In one embodiment, the spacer layer may have a thickness of about 2-8 Å. The spacer layer may be formed by, for example, PVD.

In one embodiment, the total thickness of the insertion layer is sufficiently thin to maintain magnetic coupling between the free layers. In one embodiment, the total thickness of the insertion layer $T_I$ is about 4 Å thick. The total thickness $T_{CF}$ of the composite free layer is equal to $T_F+T_I$. For example, a composite free layer may include CoFeB (12 Å)/spacer (4 Å)/CoFeB (9 Å), resulting in the $T_{CF}$=25 Å. Other thicknesses may also be useful.

A capping layer 580 may be provided over the storage layer. The capping layer, for example, serves to minimize the top electrode diffusion through the tunneling barrier or magnetic layers. The capping layer may also serve to prevent or reduce out diffusion of oxygen from the tunneling barrier layer. The capping layer, for example, may be a Ru layer or a Ta layer. Other types of capping layers may also be useful. For example, the capping layer may be a Pt capping layer. Providing a composite capping layer may also be useful. For example, the capping layer may include a Ta/Ru composite layer. Other configurations of capping layers may also be useful. The capping layer may be formed by, for example, PVD. The thickness of the capping layer, for example, may be about 5-20 Å.

Figure 5B:
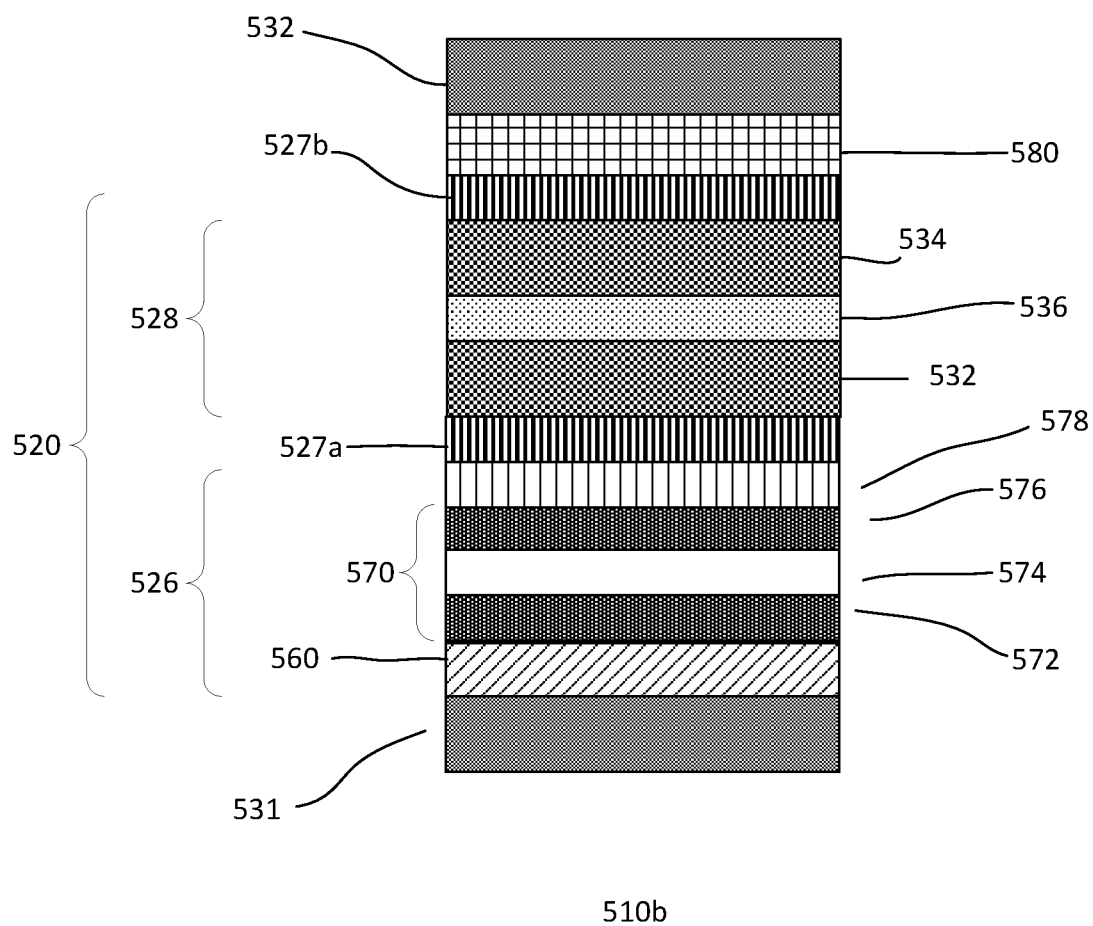

FIG. 5b shows a cross-sectional view of another embodiment of a magnetic storage unit 510b of a magnetic memory cell. In one embodiment, the storage unit includes a bottom pinned MTJ stack or element 520 disposed between bottom and top electrodes 531 and 532. The MTJ element is similar to that described in FIG. 5a. Common elements may not be described or described in detail. For example, the MTJ element may be a pMTJ or an iMTJ element.

The MTJ element includes a fixed layer 526, a free layer 528, and a tunneling barrier layer separating the fixed layer from the free layer. The fixed layer is disposed below the free layer, forming the bottom pinned MTJ element. Similar to FIG. 5a, the free layer is a composite free layer having first and second free layers 532 and 534 with an insertion layer 536 disposed between them. The fixed layer, tunneling barrier layer, and free layer form the MTJ element. As shown, the fixed layer is disposed below the free layer, forming a bottom pinned MTJ element, such as a bottom pinned pMTJ element or a bottom pinned iMTJ element.

In contrast to the MTJ element of FIG. 5a, the MTJ element of FIG. 5b includes first and second tunneling barrier layers 527a and 527b. This configuration produces a dual tunneling barrier pMTJ element. In one embodiment, the free layer 528 is disposed in between the first and second tunneling barrier layers 527a and 527b. The tunneling barrier layers, for example, may be MgO tunneling barrier layers. Other suitable types of tunneling barrier layers may also be useful. It is also understood that the tunneling barrier layers need not be the same. As for the other layers of the MTJ element, they are the same or similar.

The second tunneling barrier provides 3 interfaces with magnetic layers in the MTJ element, enhancing anisotropy, increasing thermal stability. In the case where the insertion layer includes an oxidized layer which improves ferromagnetic coupling between the free layers, additional interfaces between magnetic layers are provided. For example, the insertion layer provides two additional interfaces. In the case of a dual tunneling barrier, 5 interfaces are provided for the MTJ element. The additional interfaces further enhance PMA, which improves thermal stability.

A capping layer 580, for example, may be disposed over the second tunneling barrier layer. The capping layer, for example, may be a Ru layer or a Ta layer. Alternatively, the capping layer may be Pt. Providing a composite capping layer may also be useful. For example, the capping layer may include a Ru/Ta composite layer. For example, the Ru layer is disposed over the second tunneling barrier layer.

Figure 5C:
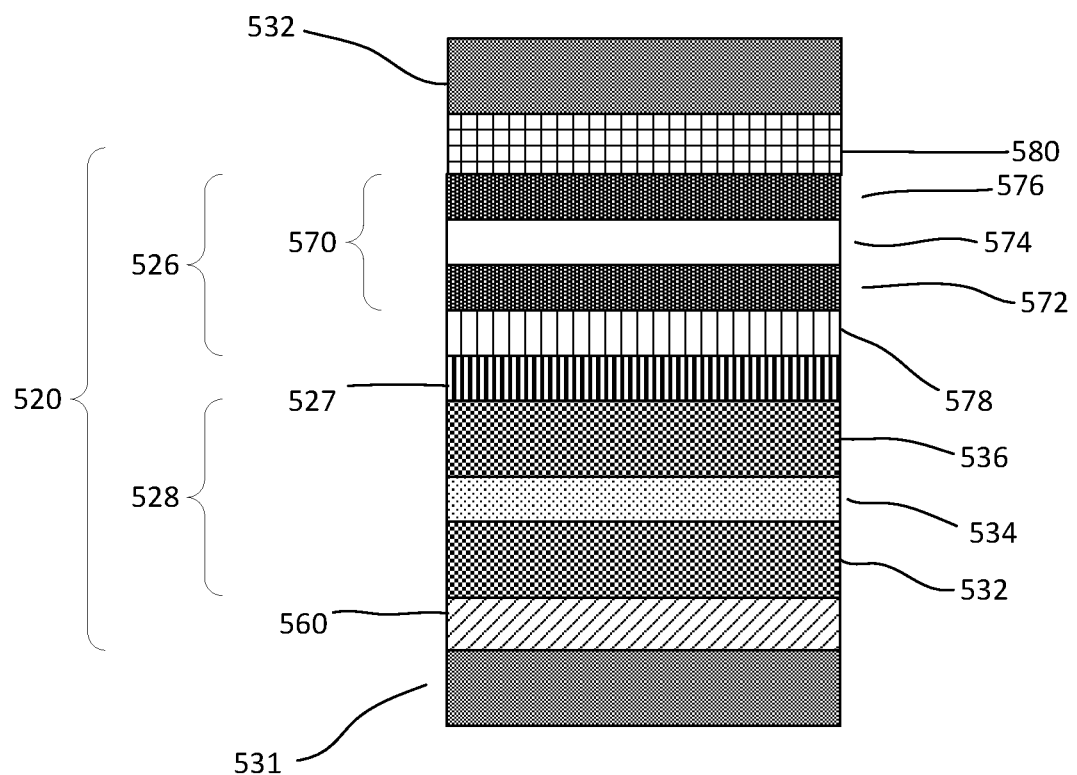

FIG. 5c shows a cross-sectional view of another embodiment of a magnetic storage unit 510c of a magnetic memory cell. In one embodiment, the storage unit includes a MTJ stack or element 520 disposed between bottom and top electrodes 531 and 532. The MTJ element is similar to that described in FIGS. 5a-5b. Common elements may not be described or described in detail. For example, the MTJ element may be a pMTJ or an iMTJ element.

The MTJ element includes a fixed layer 526, a free layer 528, and a tunneling barrier layer 527 separating the fixed layer from the free layer. The fixed layer is disposed above the free layer, forming a top pinned MTJ element. A base layer 560 may be provided on the bottom electrode. The free layer is disposed above the base layer. In one embodiment, the free layer is a composite free layer with first and second free layers 532 and 536 sandwiching an insertion layer 534. Similar to FIGS. 5a-5b, the first free layer is disposed below the second free layer.

A tunneling barrier is disposed over the free layer. The fixed layer is disposed over the tunneling barrier layer. The fixed layer, in one embodiment, includes a reference layer 578 and a hard layer 570. The hard layer, for example, may include first and second AP layers 572 and 576 separated by a coupling layer 574. Similar to FIGS. 5a-5b, the first AP layer is disposed below the second AP layer.

A capping layer 580, for example, may be disposed over the hard layer. The capping layer, for example, may be a Ru layer or a Ta layer. Alternatively, the capping layer may be a Pt layer. Providing a composite capping layer may also be useful. For example, the capping layer may include a Ru/Ta composite layer.

Figure 5D:
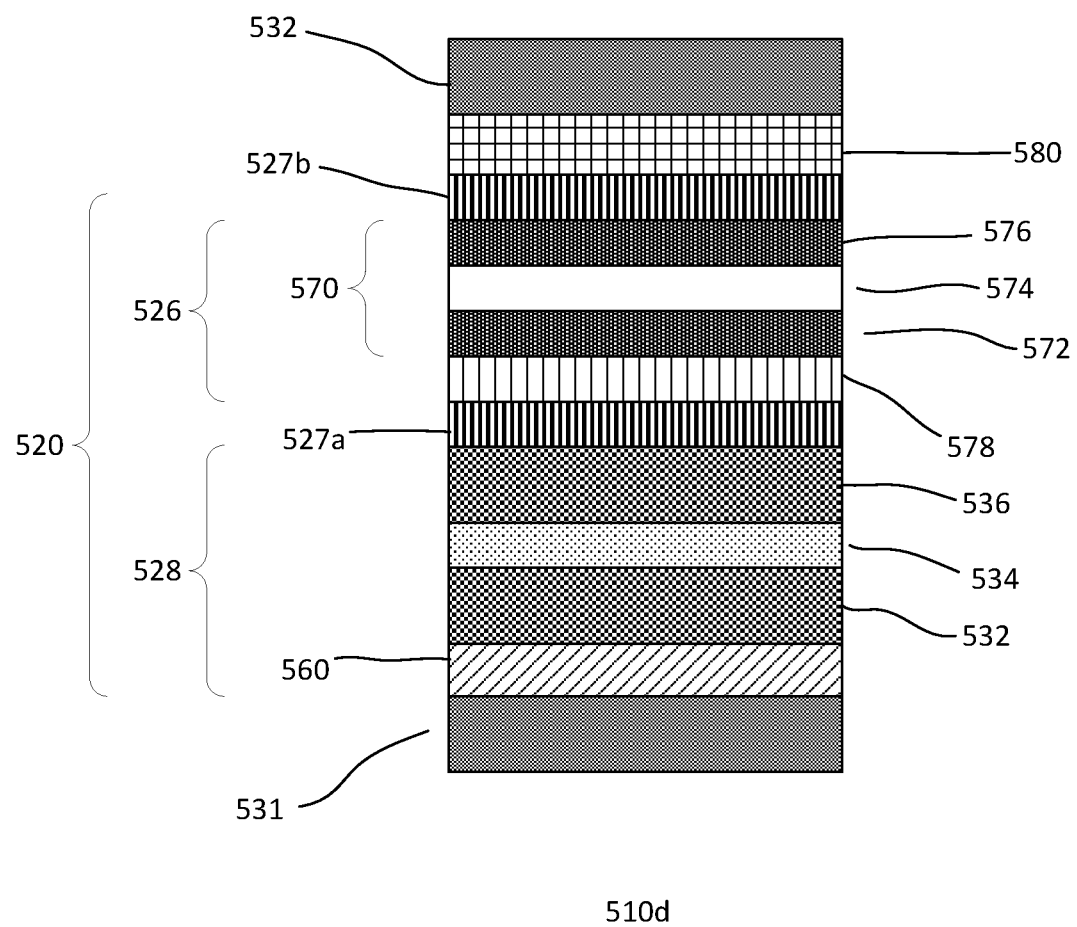

FIG. 5d shows a cross-sectional view of another embodiment of a magnetic storage unit 510d of a magnetic memory cell. In one embodiment, the storage unit includes a MTJ stack or element 520 disposed between bottom and top electrodes 531 and 532. The MTJ element is similar to that described in FIGS. 5a-5c. Common elements may not be described or described in detail. For example, the MTJ element may be a pMTJ or an iMTJ element.

The MTJ element includes a fixed layer 526, a free layer 528, and a tunneling barrier layer separating the fixed layer from the free layer. The fixed layer is disposed above the free layer, forming a top pinned MTJ element. A base layer 560 may be provided on the bottom electrode. The free layer is disposed above the base layer. In one embodiment, the free layer is a composite free layer with first and second free layers 532 and 536 sandwiching an insertion layer 534. Similar to FIGS. 5a-5b, the first free layer is disposed below the second free layer.

In contrast to the MTJ element of FIG. 5c, the MTJ element of FIG. 5d includes first and second tunneling barrier layers 527a and 527b. This configuration produces a dual tunneling barrier pMTJ element. In one embodiment, the fixed layer 528 is disposed in between the first and second tunneling barrier layers 527a and 527b. The tunneling barrier layers, for example, may be MgO tunneling barrier layers. Other suitable types of tunneling barrier layers may also be useful. It is also understood that the tunneling barrier layers need not be the same. As for the other layers of the MTJ element, they are the same or similar.

A capping layer 580, for example, may be disposed over the second tunneling barrier layer. The capping layer, for example, may be a Ru layer or a Ta layer. Alternatively, the capping layer may be Pt. Providing a composite capping layer may also be useful. For example, the capping layer may include a Ru/Ta composite layer. For example, the Ru layer is disposed over the second tunneling barrier layer.

To improve interface smoothness of the layers, plasma treatment and surfactant layer may be introduced at the seed layer or bottom electrode. Such plasma treatment and surfactant layer are described in, for example, U.S. patent application Ser. No. 15/057,107 and U.S. patent application Ser. No. 15/057,109, both filed on Feb. 29, 2016, and U.S. patent application Ser. No. 15/075,222, filed on Mar. 21, 2016, which are herein incorporated by references for all purposes.

FIGS. 6a-6l show cross-sectional views of an embodiment of a process 600 for forming a device. The process includes forming a memory cell. The memory cell, for example, may be a magnetic random access memory (MRAM) cell. The memory cell, for example, is the same or similar to that described in FIG. 2 and includes an MTJ element as described in FIGS. 5a-5d. Common elements may not be described or described in detail.

The cross-sectional views, for example, are along the bit line direction. Although the cross-sectional views show one memory cell, it is understood that the device includes a plurality of memory cells of, for example, a memory array. In one embodiment, the process of forming the cell is highly compatible with CMOS logic process. For example, the cell can be formed simultaneously with CMOS logic devices (not shown) on the same substrate.

Figure 6A:
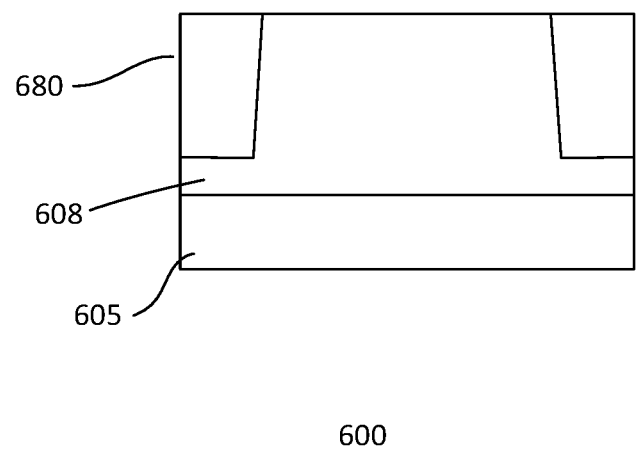

Referring to FIG. 6a, a substrate 605 is provided. The substrate, for example, is a semiconductor substrate, such as a silicon substrate. The substrate may be a lightly doped p-type substrate. Providing an intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions 680 are formed in the substrate. In one embodiment, the isolation regions are shallow trench isolation (STI) regions. Other types of isolation regions may also be useful. The isolation regions are provided to isolate device regions from other regions. The isolation regions may also isolate contact regions within a cell region. Isolation regions may be formed by, for example, etching trenches in the substrate and filling them with a dielectric material, such as silicon oxide. A planarization process, such as chemical mechanical polish (CMP), is performed to remove excess dielectric material, leaving, for example, STI regions isolating the device regions.

A doped well or device well 608 is formed. The well, for example, is formed after forming the isolation regions. In one embodiment, the well serves as a well for the select transistors of the selector unit. The well, for example, is a second polarity type doped well. The second polarity type is the opposite polarity type of the transistor of the cell selector unit. In one embodiment, the device well is a p-type well for a n-type cell select transistor, such as a metal oxide semiconductor field effect transistor (MOSFET). The device well serves as a body of the select transistor.

In one embodiment, an implant mask may be employed to implant the dopants to form the doped well. The implant mask, for example, is a patterned photoresist layer. The implant mask exposes regions of the substrate in which the second polarity wells are formed. The device well may be lightly or intermediately doped with second polarity type dopants. For example, the device well may have a dopant concentration of about 1E15 to $1E19/cm^3$. Other dopant concentrations may also be useful. The well, for example, may be a common device well for the array.

The process may include forming other wells for other device regions. In the case where the wells are different polarity types or dopant concentrations, they may be formed using separate processes, such as separate mask and implants. For example, first polarity typed doped wells, wells of different dopant concentrations as well as other wells may be formed using separate masks and implant processes.

Figure 6B:
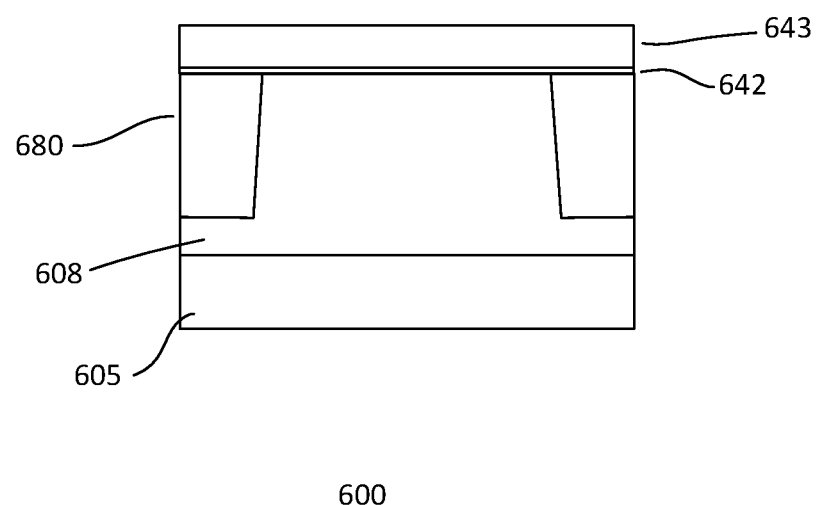

As shown in FIG. 6b, gate layers are formed on the substrate. The gate layers, in one embodiment, include a gate dielectric layer 642 and a gate electrode layer 643 thereover. The gate dielectric layer, for example, may be a silicon oxide layer. The gate dielectric layer may be formed by thermal oxidation. As for the gate electrode layer, it may be a polysilicon layer. The gate electrode layer may be formed by chemical vapor deposition (CVD). Other suitable types of gate layers, including high k dielectric and metal gate electrode layers, or other suitable techniques for forming gate layers may also be useful.

Figure 6C:
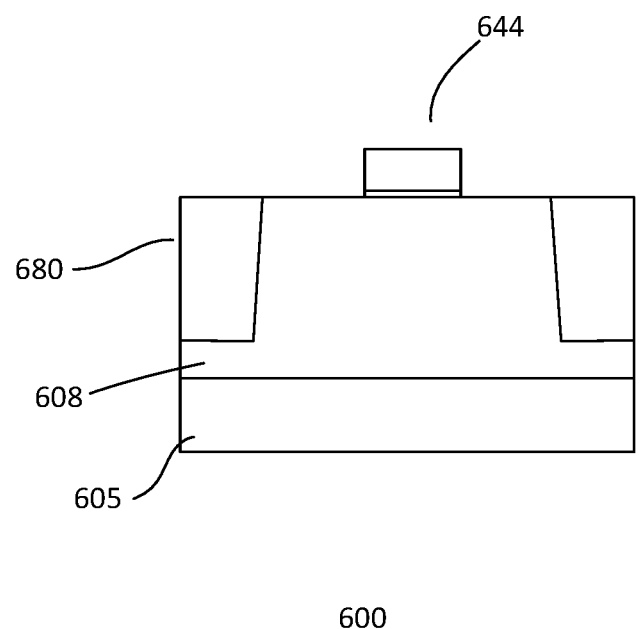

Referring to FIG. 6c, the gate layers are patterned to form a gate 644 of the select transistor of the select unit. Patterning the gate layers may be achieved using mask and etch techniques. For example, a soft mask, such as a photoresist may be formed over the gate electrode layer. An exposure source may selectively expose the photoresist layer through a reticle containing the desired pattern. After selectively exposing the photoresist layer, it is developed to form openings corresponding to locations where the gate layers are to be removed. To improve lithographic resolution, an anti-reflective coating (ARC) may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. Patterning the gate layers forms the gate of the select transistor. The gate, for example, may be a gate conductor along a first or word line direction. A gate conductor forms a common gate for a row of memory cells. It is understood that gates of the memory cells of the array may be formed.

Figure 6D:
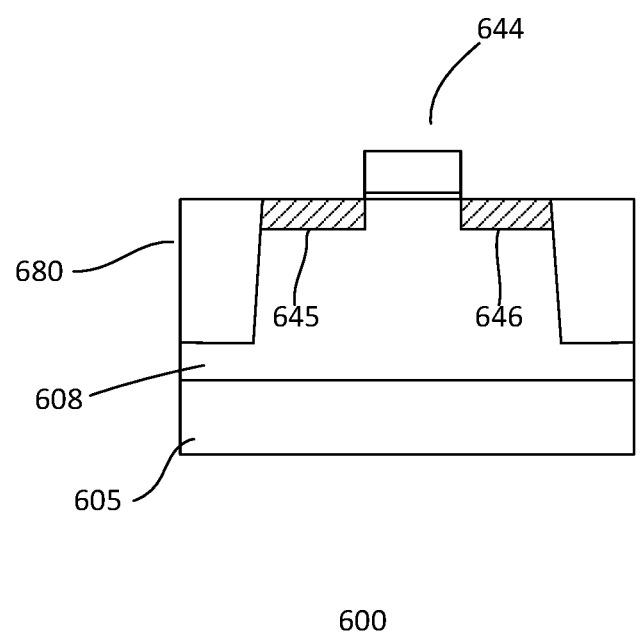

Referring to FIG. 6d, an implant is performed to first and second S/D regions 645 and 646 on sides of the gate. The implant, for example, implants first polarity type dopants to form first polarity type S/D regions. An implant mask (not shown) may be used to form the first polarity type S/D regions in the substrate. In one embodiment, the implant forms heavily doped first polarity type S/D regions in the substrate adjacent to the gates. The first polarity type dopants, for example, include n-type dopants. The implantation process to form the first polarity type S/D regions may be performed together while forming first polarity type S/D regions in other device regions (not shown) on the same substrate as well as first polarity type contact regions. The S/D regions, for example, include dopant concentration of about 5E19 to 1E21/cm$^3$. Other dopant concentration may also be useful.

A lightly doped (LD) extension implant may be performed to form LD extension regions (not shown) of the S/D regions. The LD extension implant may be performed prior to forming the S/D regions. An implant mask may be used to form the LD extension regions. To form the LD extension regions, first polarity type dopants are implanted into the substrate. The first polarity type dopants, for example, include n-type dopants. In one embodiment, the implant forms LD extension regions in the substrate adjacent to the gates. For example, the LD extension regions extend slightly under the gates and are typically shallower than the S/D regions. The LD extension regions, for example, include dopant concentration of about 1E18 to 5E19/cm$^3$. Other dopant concentrations may also be useful. In some embodiments, a halo region may also be formed. The halo region may be formed at the same time as the LD extension region. After forming the LD extension regions, sidewall spacers (not shown) may be formed on sidewalls of the gate followed by forming the S/D regions.

Separate implants for second polarity type S/D and extension regions may be performed. The second polarity type implants form S/D and extension regions for second polarity type transistors in other device regions as well as second polarity type contact regions.

Figure 6E:
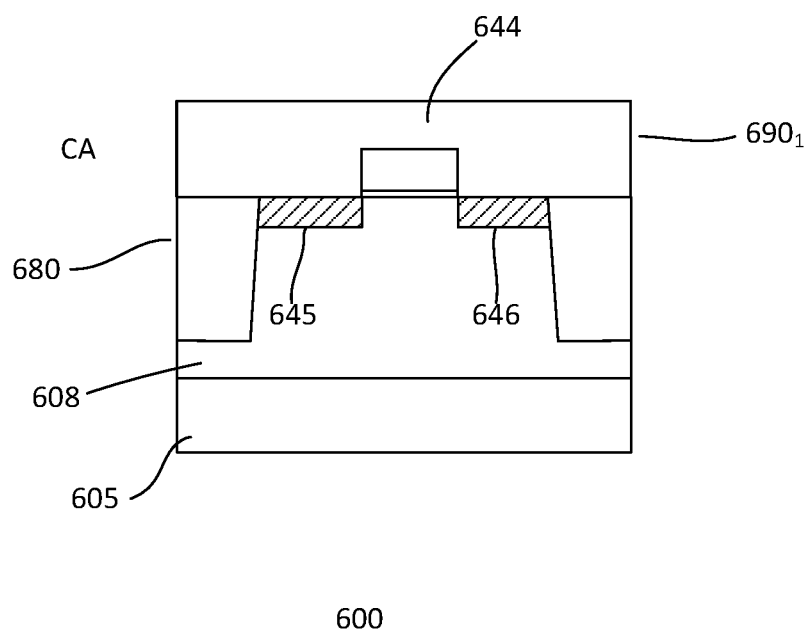

Referring to FIG. 6e, a dielectric layer 690$_1$ is formed on the substrate, covering the transistor. The dielectric layer, for example, serves as a dielectric layer of an ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

Figure 6F:
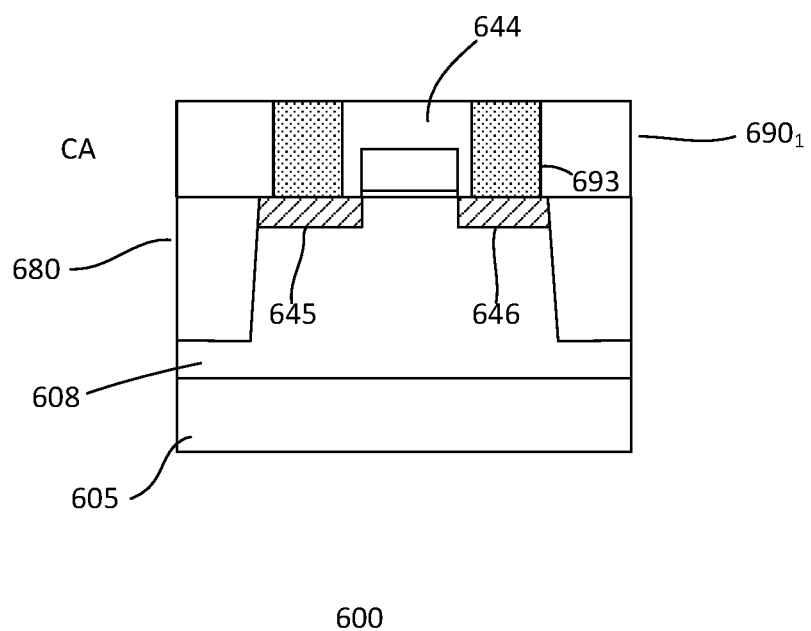

In one embodiment, contacts 693 are formed in the dielectric layer 690$_1$ as shown in FIG. 6f. The contacts, for example, connect to contact regions, such as S/D regions and gate (not shown). Forming the contacts may include forming contact vias in the dielectric layer to expose the contact regions. Forming the contact vias may be achieved using mask and etch techniques. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

Figure 6G:
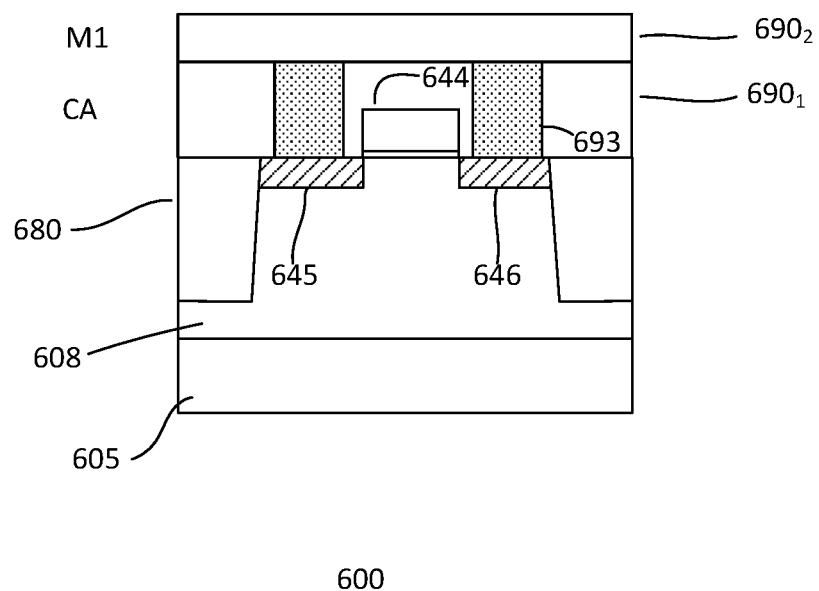

In FIG. 6g, a dielectric layer 690$_2$ is formed over the substrate, covering the lower dielectric layer 690$_1$. The dielectric layer 690$_2$, for example, serves as a metal level of an ILD layer. In one embodiment, the dielectric layer serves as M1 level of the ILD layer. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Figure 6H:
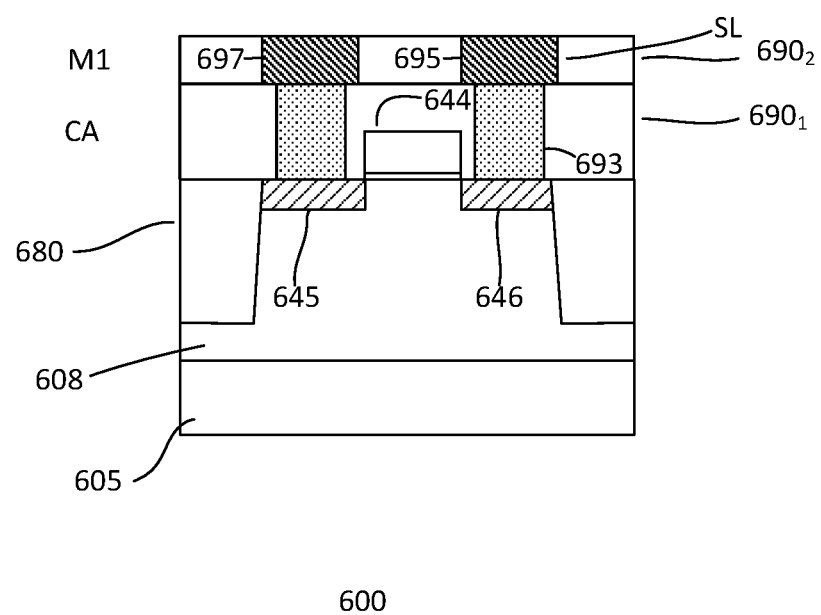

In FIG. 6h, conductive or metal lines 695 are formed in the dielectric layer 690$_2$. The conductive lines may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, a source line SL is formed to connect to the source region 646 of the transistor while other interconnects, such as interconnect pad 697 formed in M1 is coupled to the drain region 645. The SL, for example, may be along the wordline direction. Providing SL in the bitline direction may also be useful. As for the interconnect pad, it may serve as a storage pad. Other conductive lines and pads may also be formed.

Figure 6I:
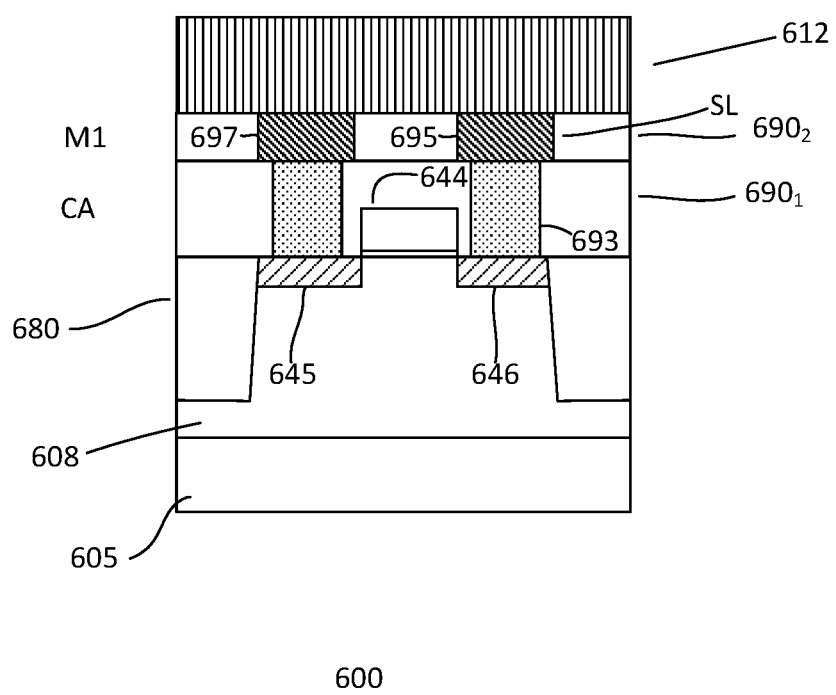
Figure 6J:
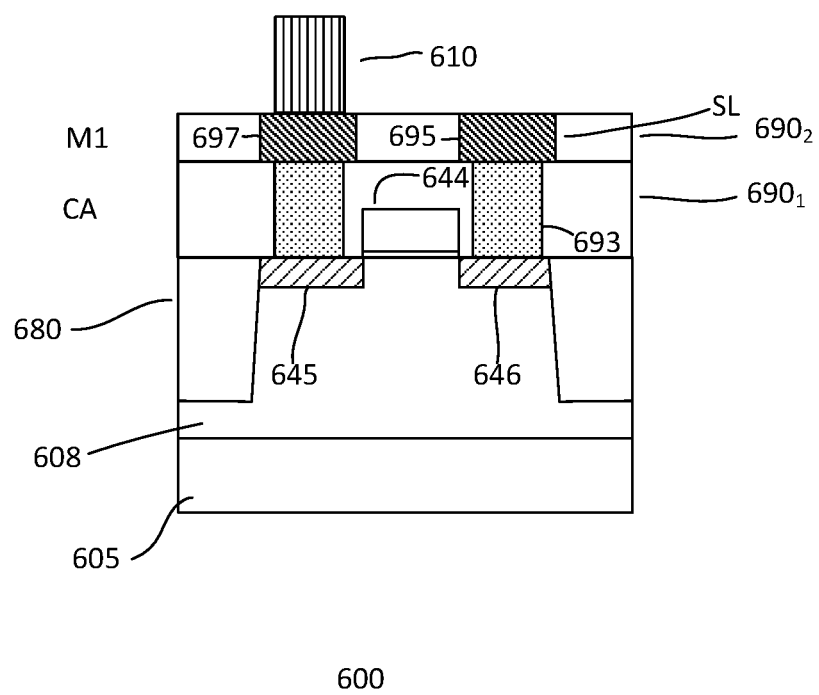

As shown in FIG. 6i, the process continues to form a storage unit of the memory cell. In one embodiment, the process forms various layers of a storage unit with an MTJ element. The various layers 612 are formed on the dielectric layer 690$_2$. The layers may include layers as described in FIG. 5a, 5b, 5c or 5d. The layers may be formed by PVD or other suitable deposition techniques. The deposition technique may depend on the type of layer. The layers are patterned to form a storage unit 610 with an MTJ element, as shown in FIG. 6j. Patterning the layers may be achieved using an anisotropic etch, such as RIE, with a patterned mask layer. Other suitable techniques for forming the MTJ element may also be useful.

Figure 6K:
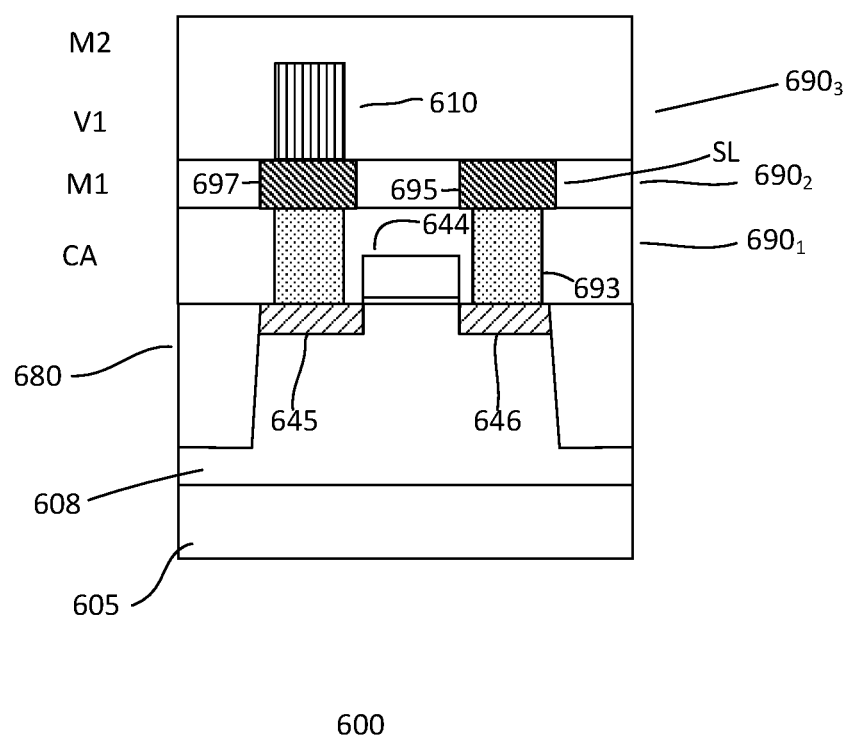
Figure 6I:
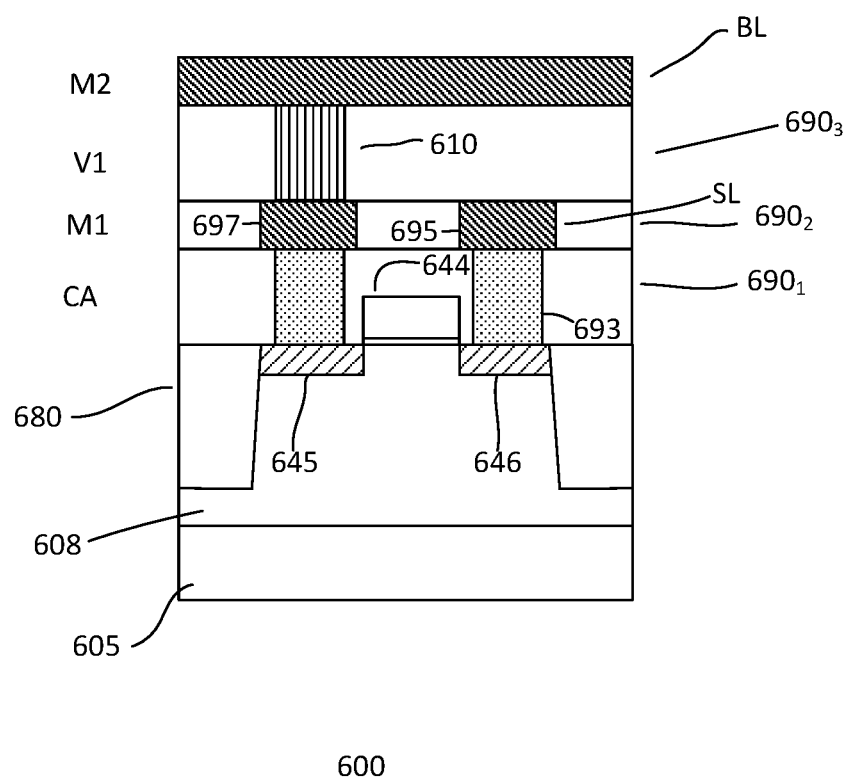

Referring to FIG. 6k, a storage dielectric layer 6903 is formed over the MTJ storage unit. The dielectric layer covers the storage unit 610. The storage dielectric layer, for example, is a silicon oxide layer. The storage dielectric layer may be formed by, for example, CVD. Other types of storage dielectric layers or forming techniques may also be useful. A planarization process is performed to remove excess dielectric material to form a planar surface. The planarization process, for example, is CMP. As shown, the storage dielectric layer is disposed above the surface of the storage unit. For example, the storage dielectric layer includes V1 and M2 levels.

In FIG. 6l, a conductive or metal line is formed in the dielectric layer in M2. For example, a bitline BL is formed in M2 of the dielectric layer, coupling the storage unit. Other metal lines may also be formed. The metal lines in M2 may be formed using a dual damascene technique.

Additional processes may be performed to complete forming the device. For example, the processes may include forming additional ILD levels, pad level, passivation level, pad opening, dicing, assembly and testing. Other types of processes may also be performed.

As described, the storage unit is formed in V1 and BL is formed in M2. Forming the storage unit and BL in other ILD levels, such as in an upper ILD level, may also be useful. In the case where the storage unit is provided in an upper ILD level, contact and interconnect pads may be formed in the intermediate ILD levels to connect to the storage unit. The contact and interconnect pads may be formed using dual damascene techniques.

In addition, a metal wordline may be provided in a metal layer above the gate. The metal wordline, for example, may be coupled to the gate of the select transistor. The metal wordline may be provided in M1 or other metal levels. For example, the metal wordline may be parallel with the SL. Also, as described, the various components are disposed in specific via or metal levels. It is understood that other configurations of the memory cell may also be useful. For example, the components may be disposed in other metal or via levels.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory cell comprising:
   a select unit on a substrate, the select unit including a transistor with a first source/drain region;
   a dielectric layer on the substrate covering the select unit, the dielectric layer including a storage pad coupled to the first source/drain region of the transistor; and
   a storage unit on the storage pad, the storage unit including a bottom electrode, a top electrode, and a magnetic tunnel junction element disposed between the top electrode and the bottom electrode, the magnetic tunnel junction element including a magnetic fixed layer, a tunneling barrier layer, and a composite magnetic free layer, the tunneling barrier layer disposed between the magnetic fixed layer and the composite magnetic free layer, and the composite magnetic free layer including a first magnetic free layer, a second magnetic free layer, and an insertion layer separating the first magnetic free layer and the second magnetic free layer,
   wherein the insertion layer comprises a base layer that includes magnesium oxide or hafnium oxide, and the insertion layer is configured to ferromagnetically couple the first magnetic free layer and the second magnetic free layer.

2. The memory cell of claim 1, wherein the transistor includes a second source/drain region and a gate between the first source/drain region and the second source/drain region.

3. The memory cell of claim 1 further comprising:
   a bitline coupled to the top electrode of the storage unit.

4. The memory cell of claim 1 wherein the tunneling barrier layer is disposed on a surface of the second magnetic free layer to form a top pinned magnetic tunnel junction element.

5. The memory cell of claim 1 wherein the tunneling barrier layer is disposed below the first magnetic free layer to form a bottom pinned magnetic tunnel junction element.

6. The memory cell of claim 1 wherein the insertion layer has a thickness in a range of 0.2 nanometers to 0.5 nanometers.

7. The memory cell of claim 1 wherein the insertion layer has a thickness of less than one monolayer.

8. The memory cell of claim 1 further comprising:
   a spacer layer between the base layer and the second magnetic free layer.

9. The memory cell of claim 8 wherein the spacer layer comprises tantalum.

10. The memory cell of claim 8 wherein the spacer layer comprises titanium or hafnium.

* * * * *